US010446411B2

(12) United States Patent
Chen et al.

(10) Patent No.: US 10,446,411 B2
(45) Date of Patent: *Oct. 15, 2019

(54) SEMICONDUCTOR DEVICE PACKAGE WITH A CONDUCTIVE POST

(71) Applicant: Advanced Semiconductor Engineering, Inc., Kaohsiung (TW)

(72) Inventors: Tien-Szu Chen, Kaohsiung (TW); Kuang-Hsiung Chen, Kaohsiung (TW); Sheng-Ming Wang, Kaohsiung (TW); Yu-Ying Lee, Kaohsiung (TW); Yu-Tzu Peng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/102,527

(22) Filed: Aug. 13, 2018

(65) Prior Publication Data

US 2018/0350626 A1 Dec. 6, 2018

Related U.S. Application Data

(63) Continuation of application No. 15/453,656, filed on Mar. 8, 2017, now Pat. No. 10,049,893.

(Continued)

(51) Int. Cl.
*H01L 23/48* (2006.01)
*H01L 21/44* (2006.01)
(Continued)

(52) U.S. Cl.
CPC .... *H01L 21/4853* (2013.01); *H01L 23/49811* (2013.01); *H01L 24/05* (2013.01);
(Continued)

(58) Field of Classification Search
CPC ... H01L 24/13; H01L 24/05; H01L 23/49811; H01L 21/4853; H01L 25/105; H01L 24/24; H01L 24/83
See application file for complete search history.

(56) References Cited

U.S. PATENT DOCUMENTS 5,631,499 A    5/1997  Hosomi et al.
5,912,510 A    6/1999  Hwang et al.
(Continued)

FOREIGN PATENT DOCUMENTS

CN    102810490 A    12/2012
TW    201448149 A    12/2014
(Continued)

OTHER PUBLICATIONS

Non-Final Office Action for U.S. Appl. No. 15/453,656, dated Aug. 31, 2017.

(Continued)

*Primary Examiner* — Alonzo Chambliss
(74) *Attorney, Agent, or Firm* — Foley & Lardner LLP; Cliff Z. Liu

(57) ABSTRACT

A semiconductor package includes: (1) a substrate; (2) a first isolation layer disposed on the substrate, the first isolation layer including an opening; (3) a pad disposed on the substrate and exposed from the opening; (4) an interconnection layer disposed on the pad; and (5) a conductive post including a bottom surface, the bottom surface having a first part disposed on the interconnection layer and a plurality of second parts disposed on the first isolation layer.

18 Claims, 30 Drawing Sheets

Related U.S. Application Data

(60) Provisional application No. 62/334,861, filed on May 11, 2016, provisional application No. 62/352,299, filed on Jun. 20, 2016.

(51) Int. Cl.
| | | |
|---|---|---|
| *H01L 21/48* | (2006.01) | |
| *H01L 23/498* | (2006.01) | |
| *H01L 23/00* | (2006.01) | |
| *H01L 25/10* | (2006.01) | |
| *H01L 25/065* | (2006.01) | |
| *H01L 23/31* | (2006.01) | |
| *H05K 1/14* | (2006.01) | |
| *H05K 3/28* | (2006.01) | |
| *H01L 23/538* | (2006.01) | |

(52) U.S. Cl.
CPC .............. *H01L 24/14* (2013.01); *H01L 24/19* (2013.01); *H01L 24/20* (2013.01); *H01L 24/24* (2013.01); *H01L 24/92* (2013.01); *H01L 24/96* (2013.01); *H01L 25/0657* (2013.01); *H01L 25/105* (2013.01); *H01L 21/486* (2013.01); *H01L 23/3128* (2013.01); *H01L 23/49816* (2013.01); *H01L 23/49827* (2013.01); *H01L 23/5385* (2013.01); *H01L 24/11* (2013.01); *H01L 24/13* (2013.01); *H01L 24/16* (2013.01); *H01L 24/32* (2013.01); *H01L 24/48* (2013.01); *H01L 24/73* (2013.01); *H01L 24/83* (2013.01); *H01L 2224/0217* (2013.01); *H01L 2224/0218* (2013.01); *H01L 2224/02175* (2013.01); *H01L 2224/04105* (2013.01); *H01L 2224/05552* (2013.01); *H01L 2224/05553* (2013.01); *H01L 2224/05554* (2013.01); *H01L 2224/05555* (2013.01); *H01L 2224/05556* (2013.01); *H01L 2224/05562* (2013.01); *H01L 2224/05564* (2013.01); *H01L 2224/05582* (2013.01); *H01L 2224/11002* (2013.01); *H01L 2224/12105* (2013.01); *H01L 2224/131* (2013.01); *H01L 2224/133* (2013.01); *H01L 2224/13006* (2013.01); *H01L 2224/13016* (2013.01); *H01L 2224/13023* (2013.01); *H01L 2224/13026* (2013.01); *H01L 2224/13027* (2013.01); *H01L 2224/13028* (2013.01); *H01L 2224/13147* (2013.01); *H01L 2224/13294* (2013.01); *H01L 2224/1403* (2013.01); *H01L 2224/16227* (2013.01); *H01L 2224/2405* (2013.01); *H01L 2224/24011* (2013.01); *H01L 2224/24105* (2013.01); *H01L 2224/24146* (2013.01); *H01L 2224/24246* (2013.01); *H01L 2224/32145* (2013.01); *H01L 2224/32225* (2013.01); *H01L 2224/48227* (2013.01); *H01L 2224/73204* (2013.01); *H01L 2224/73265* (2013.01); *H01L 2224/73267* (2013.01); *H01L 2224/83005* (2013.01); *H01L 2224/92* (2013.01); *H01L 2224/96* (2013.01); *H01L 2225/06527* (2013.01); *H01L 2225/06548* (2013.01); *H01L 2225/06562* (2013.01); *H01L 2225/06582* (2013.01); *H01L 2225/1035* (2013.01); *H01L 2225/1041* (2013.01); *H01L 2225/1058* (2013.01); *H01L 2924/18162* (2013.01); *H01L 2924/19105* (2013.01); *H01L 2924/19106* (2013.01); *H05K 1/144* (2013.01); *H05K 3/284* (2013.01); *H05K 2203/1316* (2013.01)

(56) References Cited

U.S. PATENT DOCUMENTS

| | | | |
|---|---|---|---|
| 6,538,323 B1* | 3/2003 | Sakata | H01L 23/481 |
| | | | 257/734 |
| 6,683,375 B2* | 1/2004 | Joshi | H01L 24/11 |
| | | | 257/690 |
| 7,041,589 B2 | 5/2006 | Lay et al. | |
| 8,535,983 B2 | 9/2013 | Hin et al. | |
| 10,049,893 B2* | 8/2018 | Chen | H01L 25/105 |
| 2003/0006062 A1 | 1/2003 | Stone et al. | |
| 2003/0127734 A1 | 7/2003 | Lee et al. | |
| 2008/0150121 A1* | 6/2008 | Oganesian | H01L 23/3114 |
| | | | 257/692 |
| 2010/0219527 A1 | 9/2010 | Feustel et al. | |
| 2011/0215476 A1 | 9/2011 | Lee et al. | |
| 2012/0025365 A1* | 2/2012 | Haba | H01L 21/4853 |
| | | | 257/692 |
| 2012/0119360 A1* | 5/2012 | Kim | H01L 21/565 |
| | | | 257/737 |
| 2012/0306080 A1 | 12/2012 | Yu et al. | |
| 2013/0099371 A1 | 4/2013 | Cheng et al. | |
| 2013/0334684 A1 | 12/2013 | Lin et al. | |
| 2014/0038405 A1 | 2/2014 | Yu et al. | |
| 2014/0367852 A1 | 12/2014 | Tien et al. | |
| 2015/0206865 A1 | 7/2015 | Yu et al. | |
| 2016/0073499 A1 | 3/2016 | Ogawa et al. | |
| 2017/0141065 A1 | 5/2017 | Murai et al. | |
| 2017/0250170 A1 | 8/2017 | Yu et al. | |

FOREIGN PATENT DOCUMENTS

| | | |
|---|---|---|
| TW | 1517318 B | 1/2016 |
| WO | WO-2014/188760 A1 | 11/2014 |
| WO | WO-2015/198839 A1 | 12/2015 |

OTHER PUBLICATIONS

Final Office Action for U.S. Appl. No. 15/453,656, dated Nov. 26, 2018.

Notice of Allowance for U.S. Appl. No. 15/453,656, dated Apr. 11, 2018.

Japanese Office Action for corresponding Japanese Patent Application No. 2017-091536, dated Oct. 2, 2018, 9 pages (including translation).

* cited by examiner

SEMICONDUCTOR DEVICE PACKAGE WITH A CONDUCTIVE POST

CROSS-REFERENCE TO RELATED APPLICATIONS

This application is a continuation of U.S. patent application Ser. No. 15/453,656, filed on Mar. 8, 2017, which claims the benefit of and priority to U.S. Patent Application No. 62/352,299, filed on Jun. 20, 2016, and No. 62/334,861, filed on May 11, 2016, the entire contents of which are incorporated herein by reference.

BACKGROUND

1. Technical Field

The present disclosure relates to a semiconductor device package and a method of manufacturing the same. In particular, the present disclosure relates to a copper post disposed simultaneously on both a solder paste and a solder resist.

2. Description of the Related Art

For some semiconductor packages (formed by e.g. a package-on-package (PoP) technique), solder balls are used for external connection or interconnection. However, the length of the pitch of the solder balls may hinder miniaturization. A fine-pitch copper (Cu) post technique may instead be used for miniaturization. One approach of such technique is to form a hole in a passivation layer to receive Cu posts. However, implantation of the Cu posts in the holes can be challenging due to the relatively small pitch of the Cu posts. The pitches of such technique may be limited by machining tool capabilities. Another approach is to dispose the Cu posts on the conductive pads and then perform subsequent operations. In such an approach, a Cu post is disposed directly on solder paste (e.g. on a conductive pad), where the area of the solder paste is greater than that of the Cu post. During a reflow operation, the melted solder paste (which may flow when heated) may not support the Cu post. Under these conditions, the Cu post may be moved by the flowing solder paste.

SUMMARY

In some embodiments, according to an aspect, a semiconductor package includes: (1) a substrate; (2) a first isolation layer disposed on the substrate, the first isolation layer including an opening; (3) a pad disposed on the substrate and exposed from the opening; (4) an interconnection layer disposed on the pad; and (5) a conductive post including a bottom surface, the bottom surface having a first part disposed on the interconnection layer and a plurality of second parts disposed on the first isolation layer.

In some embodiments, according to another aspect, a semiconductor package includes: (1) a substrate; (2) a first isolation layer disposed on the substrate, the first isolation layer including an opening; (3) a pad disposed on the substrate and exposed from the opening; (4) an interconnection layer disposed on pad; (5) a second isolation layer disposed on the pad and encapsulating the interconnection layer; and (6) a conductive post disposed on the interconnection layer and on the second isolation layer.

DETAILED DESCRIPTION

Figure 1A:
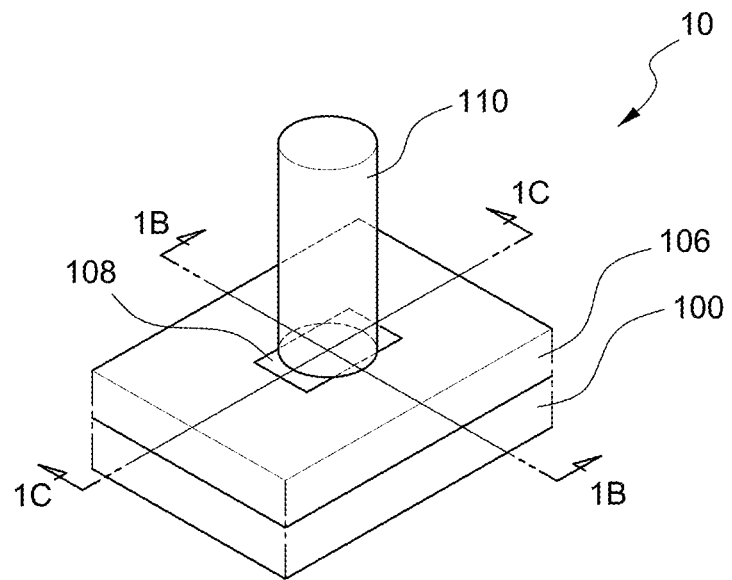
FIG. 1A is a perspective view of a semiconductor device package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1A is a perspective view of a semiconductor device package 10 in accordance with some embodiments of the present disclosure. The semiconductor device package 10 includes a carrier 100, a pad 104 (not shown in FIG. 1A), an isolation layer 106, an interconnection layer 108, and a conductive post 110. The isolation layer 106 partially covers the pad 104. The isolation layer 106 may define an opening that exposes at least a portion of the pad 104. The exposed portion of the pad 104 which is not covered by the isolation layer 106 can have a substantially rectangular or substantially square shape. In other embodiments, the pad 104 may have another shape, such as a substantially circular or substantially oval shape. The conductive post 110 is disposed on the isolation layer 106 and on the interconnection layer 108. In some embodiments, a shape of an outer edge of the interconnection layer 108 may be substantially rectangle or substantially square.

Figure 1B:
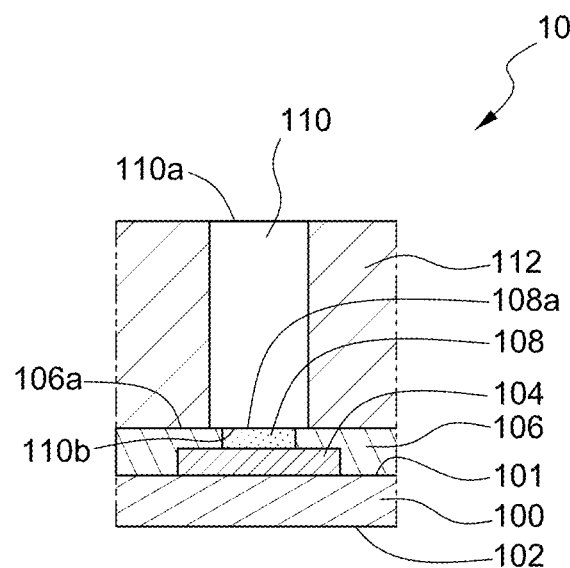
FIG. 1B is a cross-sectional view of a semiconductor device package according to some embodiments of the present disclosure.

FIG. 1B is a cross-sectional view of the semiconductor device package 10 along the crossline 1B shown in FIG. 1A, in accordance with some embodiments of the present disclosure.

The carrier 100 has a surface 101 and a surface 102 opposite the surface 101. In some embodiments described herein, the surface 101 of the carrier 100 is referred to as a top surface or a first surface and the surface 102 of the substrate is referred to as a bottom surface or a second surface. The carrier 100 may be or may include, for example, a printed circuit board, such as a paper-based copper foil laminate, a composite copper foil laminate, or a polymer-impregnated glass-fiber-based copper foil laminate. The carrier 100 may include an interconnection structure, such as a redistribution layer (RDL) or a grounding element. In some embodiments, the grounding element is a via exposed from a lateral surface of the carrier 100. In some embodiments, the grounding element is a metal layer exposed from the lateral surface of the carrier 100. In some embodiments, the grounding element is a metal trace exposed from the lateral surface of the carrier 100.

The pad 104 is disposed on the surface 101 of the carrier 100. The isolation layer 106 is disposed on the surface 101 of the carrier 100 and covers a first portion of the pad 104. A second portion of the pad 104 is exposed from the isolation layer 106. The interconnection layer 108 is formed on the exposed portion of the pad 104, over an opening defined by the isolation layer 106. In some embodiments, the area of the opening may be in a range of approximately 0.0125 millimeters squared ($mm^2$) (e.g., may be defined by sides having lengths of approximately 0.05 mm×approximately 0.25 mm) to approximately 0.08 $mm^2$ (e.g. may be defined by sides having lengths of approximately 0.2 mm×approximately 0.4 mm). The interconnection layer 108 is disposed on the pad 104 and is surrounded by the isolation layer 106. The isolation layer 106 has a top surface 106a. The isolation layer 106 may be a solder resist, such as a passivation material, a resin, or a polymer. The interconnection layer 108 has a top surface 108a. The interconnection layer 108 may be made of or may include Sn (Tin) and/or other suitable metal materials. The volume and/or weight of the interconnection layer 108 may be set as appropriate. The conductive post 110 has a top surface 110a and a bottom surface 110b. The conductive post 110 is disposed on the top surface 106a of the isolation layer 106 and on the top surface 108a of the interconnection layer 108. In some embodiments, a width of the conductive post 110 (e.g. an extension in a horizontal direction as depicted in FIG. 1B) may be in a range of approximately 0.15 mm to approximately 0.3 mm. In some embodiments, the conductive post 110 may be in a substantially cylinder shape, and a diameter of the conductive post 110 may be in a range of approximately 0.15 mm to approximately 0.3 mm. In some embodiments, a first diameter of the conductive post 110 may extend along a first direction and may extend over the interconnection layer 108 and not over the isolation layer 106, and a second diameter of the conductive post 110 in the same plane as the first diameter may extend along a second direction orthogonal to the first direction and may extend in part over the interconnection layer 108 and may further extend in part over the isolation layer 106, as shown in FIG. 1A. In other words, a first imaginary line corresponding to a diameter of the conductive post 110 can be drawn so as to extend over the interconnection layer 108 and not over the isolation layer 106 (e.g. can be drawn along the line 1C-1C shown in FIG. 1A), and a second imaginary line also corresponding to a diameter of the conductive post 110 can be drawn in a different direction than the first imaginary line and may extend over both the interconnection layer 108 and the isolation layer 106 (e.g. along the line 1B-1B shown in FIG. 1A). The top surface 106a of the isolation layer 106 and the top surface 108a of the interconnection layer 108 are substantially coplanar.

The conductive post 110 has a bottom surface 110b having a first part and a second part. The first part of the bottom surface 110b of the conductive post 110 contacts the top surface 108a of the interconnection layer 108, and the second part of bottom surface 110b of the conductive post 110 contacts the top surface 106a of the isolation layer 106. The area of the first part of the bottom surface 110b of the conductive post 110 is substantially the same as, or larger than, the area of the second part of the bottom surface 110b of the conductive post 110. The conductive post 110 may be made of Cu and/or other suitable metal materials. The isolation layer 106 and the conductive post 110 are encapsulated by a molding compound 112. In some embodiments, the conductive post 110 substantially maintains its original position during a reflow operation, and the position of the conductive post 110 is not significantly affected by flow of the melted interconnection layer 108, at least in part because the conductive post 110 is supported by the isolation layer 106.

Figure 1C:
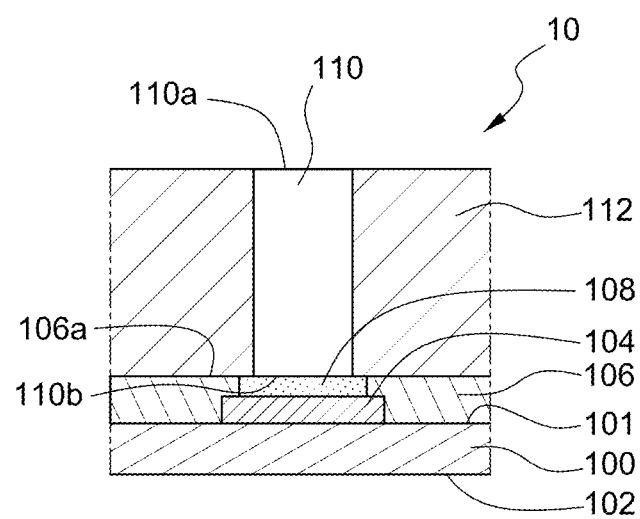
FIG. 1C is a cross-sectional view of a semiconductor device package according to some embodiments of the present disclosure.

FIG. 1C is a cross-sectional view of the semiconductor device package 10 along the crossline 1C in accordance with some embodiments of the present disclosure.

The isolation layer 106 is disposed on the surface 101 of the carrier 100. The isolation layer 106 is disposed on the surface 101 of the carrier 100 and partially covers a first portion of the pad 104. A second portion of the pad 104 is exposed from the isolation layer 106. The interconnection layer 108 is disposed on the pad 104 and is surrounded by the isolation layer 106. The conductive post 110 is disposed on the interconnection layer 108. The top surface 106a of the isolation layer 106 and the top surface 108a of the interconnection layer 108 are substantially coplanar.

Figure 2A:
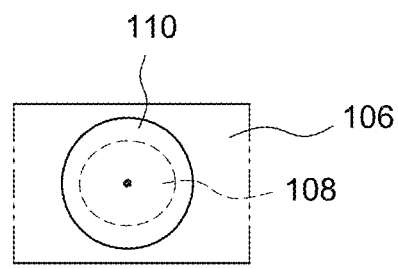
FIG. 2A illustrates a layout of a conductive post in a semiconductor device package in accordance with some embodiments of the present disclosure.

FIG. 2A illustrates a layout of the conductive post 110 in the semiconductor device package 10 in accordance with some embodiments of the present disclosure. The isolation layer 106 partially covers the pad 104, leaving a portion of the pad 104 exposed from the isolation layer 106. The exposed portion of the pad 104 has a circular shape. In some embodiments, the diameter of the circular exposed portion may be in a range of approximately 0.05 mm to approximately 0.2 mm. The interconnection layer 108 is disposed on the exposed portion of the pad 104. The shape of the interconnection layer 108 is circular. The conductive post 110 is disposed on the isolation layer 106 and the interconnection layer 108 and is substantially supported by the isolation layer 106. The interconnection layer 108 is substantially completely covered by the conductive post 110. The interconnection layer 108 and the conductive post 110 form substantially concentric circles. In some embodiments, the diameter of the conductive post 110 may be in a range of approximately 0.15 mm to approximately 0.3 mm.

Figure 2B:
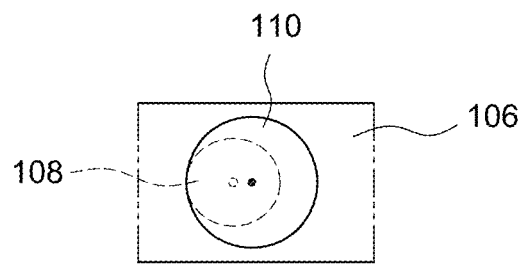
FIG. 2B illustrates a layout of a conductive post in a semiconductor device package in accordance with some embodiments of the present disclosure.

FIG. 2B illustrates a layout of the conductive post 110 in the semiconductor device package 10 in accordance with some embodiments of the present disclosure. The layout of FIG. 2B is similar to that of FIG. 2A. The opening defined by the isolation layer 106 which exposes the pad 104 has a circular shape. The interconnection layer 108 is formed on the exposed portion of the pad 104. The shape of the interconnection layer 108 is circular. The conductive post 110 is disposed on the isolation layer 106 and the interconnection layer 108 and is substantially supported by the isolation layer 106. The interconnection layer 108 is substantially completely covered by the conductive post 110. Part of an edge of the interconnection layer 108 overlaps with part of an edge of the conductive post 110. A center of the conductive post 110 is spaced apart from a center of the interconnection layer 108.

Figure 2C:
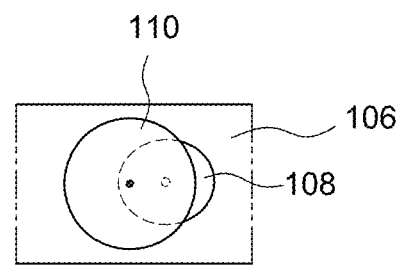
FIG. 2C illustrates a layout of a conductive post in a semiconductor device package in accordance with some embodiments of the present disclosure.

FIG. 2C illustrates a layout of the conductive post 110 in the semiconductor device package 10 in accordance with some embodiments of the present disclosure. The layout of FIG. 2C is similar to that of FIG. 2B. The shape of the interconnection layer 108 is circular. The conductive post 110 is disposed on the isolation layer 106 and on the interconnection layer 108, and is substantially supported by the isolation layer 106. The interconnection layer 108 is partially covered by the conductive post 110. A center of the conductive post 110 is spaced apart from a center of the interconnection layer 108.

Figure 3A:
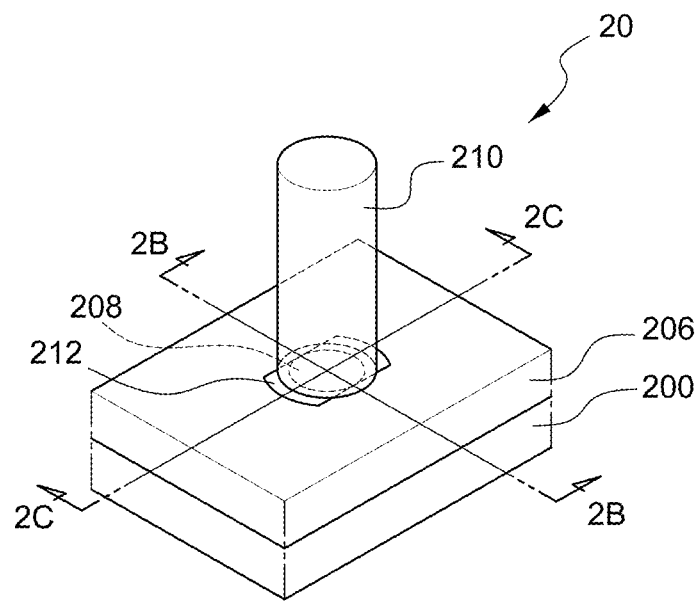
FIG. 3A is a perspective view of a semiconductor device package in accordance with some embodiments of the present disclosure.

FIG. 3A is a perspective view of a semiconductor device package 20 in accordance with some embodiments of the present disclosure. The structure of the semiconductor device package 20 is similar to that of the semiconductor device package 10. The semiconductor device package 20 includes a carrier 200, an isolation layer 206, an interconnection layer 208, a conductive post 210, and a molding compound 212. In some embodiments, the shape of the interconnection layer 208 may be circular. The interconnection layer 208 may shrink during a reflow operation. After the reflow operation, the molding compound 212 can be applied to the semiconductor device package 20 and can encapsulate a pad 204 (e.g. as shown in FIG. 3C), the isolation layer 206, the interconnection layer 208, and the conductive post 210.

In some embodiments, the interconnection layer 208 is disposed on the pad 204 and the conductive post 210 is subsequently disposed on the interconnection layer 208. In some embodiments, the interconnection layer 208 is attached to the conductive post 210, and the conductive post 210 and the interconnection layer 208 are subsequently disposed on the pad 204. Thus in some embodiments, the pitches between multiple conductive posts will not necessarily be limited by tooling capability (e.g. will not necessarily be limited by the capability of tools to form a conductive post 210 on an interconnection layer that is already attached to a semiconductor device package, in a small pitch configuration), and flexibility may be enhanced.

Figure 3B:
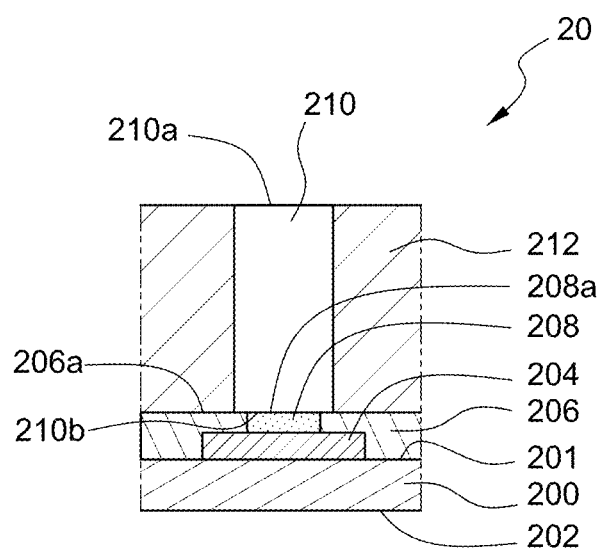
FIG. 3B is a cross-sectional view of a semiconductor device package in accordance with some embodiments of the present disclosure.

FIG. 3B is a cross-sectional view of the semiconductor device package 20 along the crossline 2B in accordance with some embodiments of the present disclosure. The carrier 200 has a top surface 201 and a bottom surface 202 opposite the top surface 201. The isolation layer 206 has a top surface 206a. The pad 204 is disposed on top surface 201 of the carrier 200. The isolation layer 206 is disposed on the top surface 201 of the carrier 200 and partially covers the pad 204. The interconnection layer 208 has a top surface 208a. Similar to the structure of FIG. 1B, the conductive post 210 has a top surface 210a and a bottom surface 210b, and the conductive post 210 is disposed on the top surface 206a of the isolation layer 206 and on the top surface 208a of the interconnection layer 208. The top surface 206a of the isolation layer 206 and the top surface 208a of the interconnection layer 208 are substantially coplanar. The bottom surface 210b of the conductive post 210 has a first part and a second part. The first part contacts the top surface 208a of the interconnection layer 208 and the second part contacts the top surface 206a of the first isolation layer 206. The area of the first part of the bottom surface 210b of the conductive post 210 is substantially the same as, or larger than, the area of the second part of the bottom surface 210b of the conductive post 210.

Figure 3C:
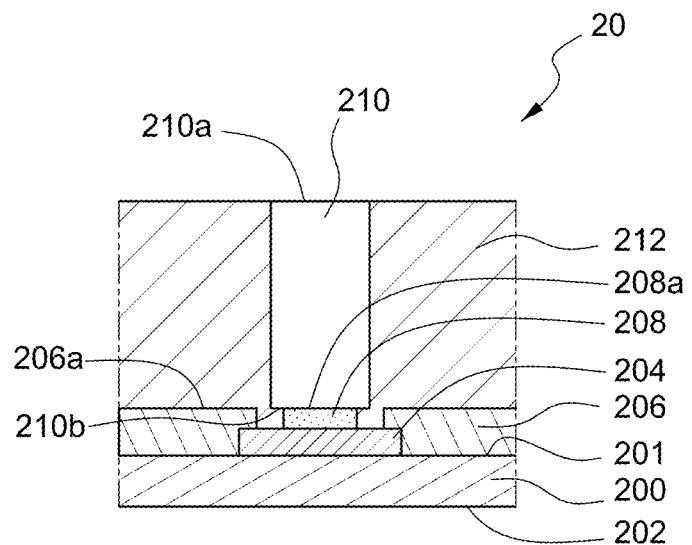
FIG. 3C is a cross-sectional view of a semiconductor device package in accordance with some embodiments of the present disclosure.

FIG. 3C is a cross-sectional view of the semiconductor device package 20 along the crossline 2C in accordance with some embodiments of the present disclosure. The volume and/or weight of the interconnection layer 208 may be set as appropriate, and the area of the top surface 208a of the interconnection layer 208 may be set as appropriate. In some embodiments, the interconnection layer 208 may be in a substantially circular shape and a diameter of the interconnection layer 208 may be in a range of approximately 0.05 mm to approximately 0.2 mm. The interconnection layer 208 may shrink during a reflow operation, creating or enlarging a gap between the isolation layer 206 and the interconnection layer 208. The gap can be filled with the molding compound 212. The molding compound 212 contacts each of the pad 204, the isolation layer 206, the interconnection layer 208, and the conductive post 210. The molding compound 212 encapsulates each of the pad 204, the isolation layer 206, the interconnection layer 208, and the conductive post 210.

In some embodiments, the pad 204 has a first portion, a second portion, and a third portion. The isolation layer 206 covers the first portion of the pad 204. The interconnection layer 208 contacts and covers the second portion of the pad 204. The molding compound 212 contacts and covers the third portion of the pad. In some embodiments, the conductive post 210 substantially maintains its original position during a reflow operation, and the position of the conductive post 210 is not significantly affected by flow of the melted interconnection layer 208, at least in part because the conductive post 210 is supported by both the isolation layer 206 and the molding compound 212.

Figure 4A:
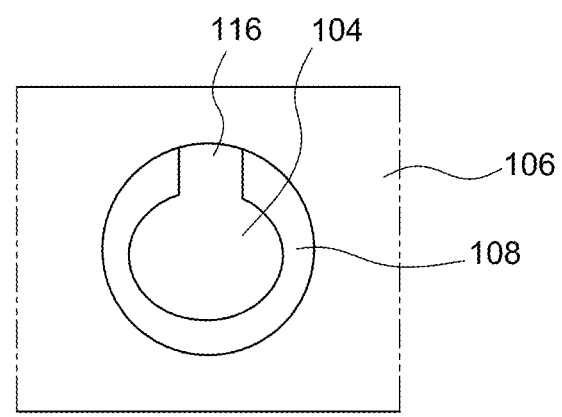
FIG. 4A illustrates a layout of a pad in a semiconductor device package in accordance with some embodiments of the present disclosure.

FIG. 4A illustrates a layout of a pad 104 in a semiconductor device package 10 in accordance with some embodiments of the present disclosure. An isolation layer 106 is disposed on a carrier 100. The isolation layer 106 defines an opening. A pad 104 and a trace 116 are formed in the opening. The isolation layer 106 surrounds the pad 104 and the trace 116. One end of the trace 116 may contact the isolation layer 106. An interconnection layer 108 is formed in the opening. The interconnection layer 108 fully covers the pad 104 and the trace 116.

Figure 4B:
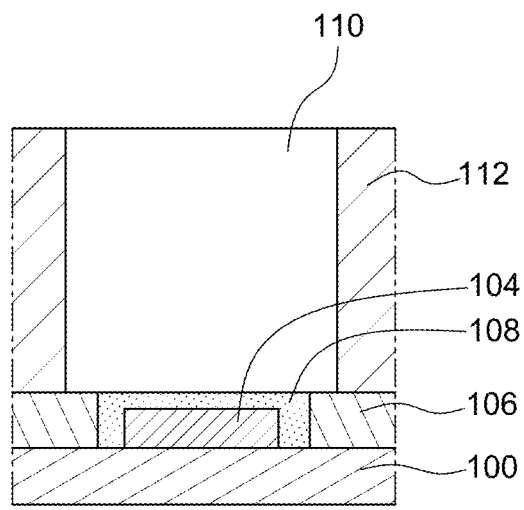
FIG. 4B is a cross-sectional view of a semiconductor device package according to some embodiments of the present disclosure.

FIG. 4B is a cross-sectional view of the semiconductor device package 10 according to some embodiments of the present disclosure. The isolation layer 106 is formed on the carrier 100. The pad 104 is formed on the carrier 100. The interconnection layer 108 is formed on the carrier 10 and fully covers the pad 104. A top surface of the isolation layer 106 and a top surface of the interconnection layer 108 are coplanar. The conductive post 110 is disposed on the isolation layer 106 and on the interconnection layer 108 and is substantially supported by the isolation layer 106. The isolation layer 106 and the conductive post 110 are encapsulated by a molding compound 112.

Figure 5A:
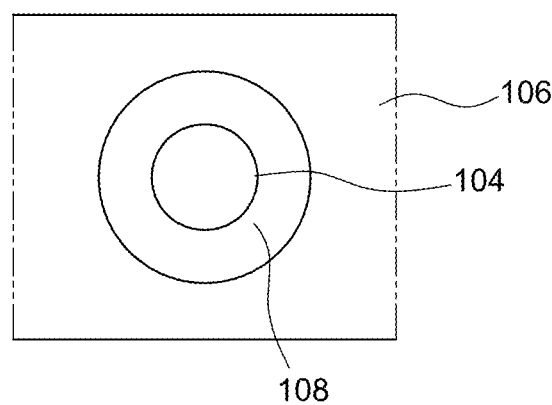
FIG. 5A illustrates a layout of a pad in a semiconductor device package in accordance with some embodiments of the present disclosure.

FIG. 5A illustrates a layout of the pad 104 in the semiconductor device package 10 in accordance with some embodiments of the present disclosure. The layout of FIG. 5A is similar to that of FIG. 4A. The isolation layer 106 is formed on the carrier 100. The isolation layer 106 defines an opening. The pad 104 is formed on the carrier 10 and on an additional via 118 (shown in FIG. 5B). The pad 104 and the opening form concentric circles.

Figure 5B:
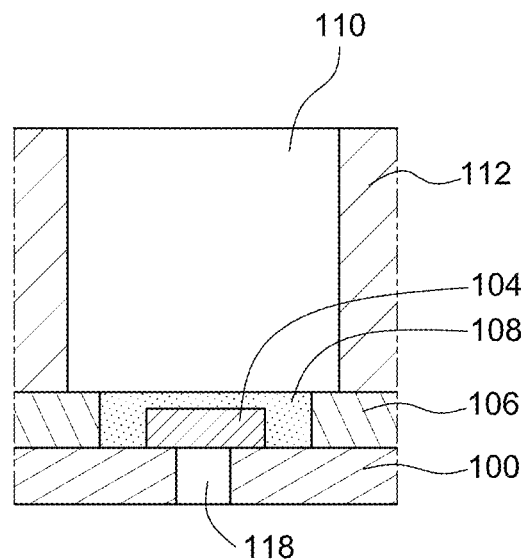
FIG. 5B is a cross-sectional view of a semiconductor device package according to some embodiments of the present disclosure.

FIG. 5B is a cross-sectional view of the semiconductor device package 10 according to some embodiments of the present disclosure. The structure of FIG. 5B is similar to that of FIG. 4B. The additional via 118 is formed in the carrier 100. The additional via 118 is electrically connected to the pad 104, the interconnection layer 108, and the conductive post 110.

Figure 6A:
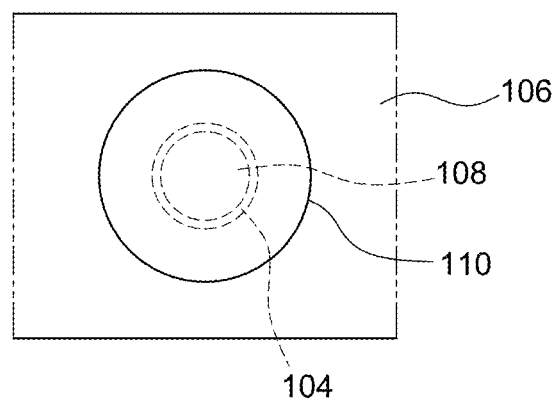
FIG. 6A depicts a layout of a conductive post in a semiconductor device package in accordance with some embodiments of the present disclosure.

FIG. 6A depicts a layout of a conductive post 110 in a semiconductor device package 10 in accordance with some embodiments of the present disclosure. A pad 104 is partially covered by an isolation layer 106. An opening defined by the isolation layer 106 has a circular shape and exposes a portion of the pad 104. An interconnection layer 108 is formed in the opening. The interconnection layer 108 is disposed on the pad 104. A conductive post 110 is disposed on the isolation layer 106 and on the interconnection layer 108, and is substantially supported by the isolation layer 106. A space surrounding the pad 104, the isolation layer 106, the interconnection layer 108, and the conductive post 110 may be filled by a molding compound 112. In some embodiments, the size of the conductive post 110 may be in a range of approximately 180 μm to approximately 220 μm. For example, the size of the conductive post 110 is approximately 200 μm.

Figure 6B:
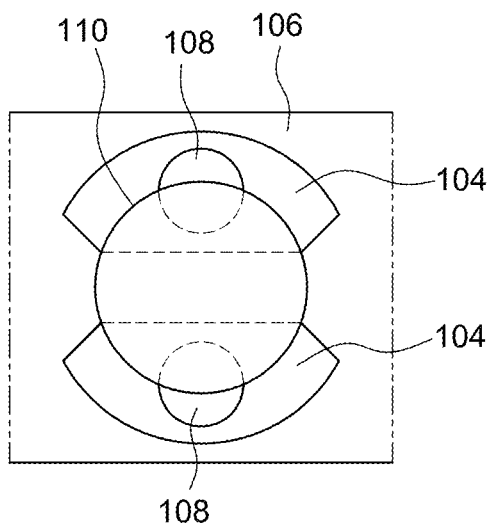
FIG. 6B depicts a layout of a conductive post in a semiconductor device package in accordance with some embodiments of the present disclosure.

FIG. 6B depicts a layout of a conductive post 110 in a semiconductor device package 10 in accordance with some embodiments of the present disclosure. The pad 104 is partially covered by the isolation layer 106. Two separate openings are defined by the isolation layer 106 and expose the pad 104. In some embodiments, the openings may be substantially in the shape of a trapezoid. In some embodiments the openings may be substantially in the shape of a polygon. In some embodiments, the openings may have a shape defined by a first straight line extending in a first direction (e.g. a horizontal direction as shown in FIG. 6B) and a convex arc facing the first straight line and extending beyond the first straight line in the first direction, and each end of the arc may be connected to a respective end of the first straight line by a second straight line and a third straight line, respectively. Two interconnection layers 108 are respectively formed in the openings. The conductive post 110 is disposed on the isolation layer 106 and on the interconnection layers 108, and is substantially supported by the isolation layer 106. A space surrounding the pad 104, the isolation layer 106, the interconnection layer 108, and the conductive post 110 may be filled by a molding compound 112. In some embodiments, the conductive post 110 is cylindrical and a diameter of the conductive post 110 may be in a range of approximately 180 μm to approximately 220 μm. For example, the diameter of the conductive post 110 is approximately 200 μm. In some embodiments, a radial distance between an outside curved edge of at least one of the openings and an outside edge of the conductive post 110 in the same plane may be in a range of approximately 40 μm to approximately 60 μm. For example, the radial distance is approximately 50 μm.

Figure 6C:
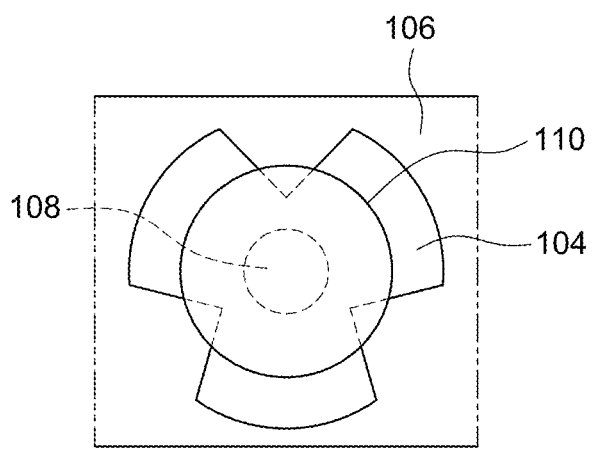
FIG. 6C depicts a layout of a conductive post in a semiconductor device package in accordance with some embodiments of the present disclosure.

FIG. 6C depicts a layout of a conductive post 110 in a semiconductor device package 10 in accordance with some embodiments of the present disclosure. A pad 104 is partially covered by the isolation layer 106. An opening defined by the isolation layer 106 that exposes the pad 104 has an incomplete circular shape. For example, the opening may be substantially in a shape of three circular sectors integrally connected at a center part of an imaginary circle that includes the circular sectors, as shown in FIG. 6C. An interconnection layer 108 is formed in the opening. The conductive post 110 is disposed on the isolation layer 106 and on the interconnection layer 108, and is substantially supported by the isolation layer 106. The space surrounding the pad 104, the isolation layer 106, the interconnection layer 108, and the conductive post 110 may be filled by a molding compound 112. For example, the interconnection layer 108 is formed approximately in a center of the opening. In some embodiments, the conductive post 110 is cylindrical and a diameter of the conductive post 110 may be in a range of approximately 180 μm to approximately 220 μm. For example, the diameter of the conductive post 110 is approximately 200 μm. In some embodiments, a radial distance between an outside curved edge of at least one of the openings and an outside edge of the conductive post 110 in the same plane may be in a range of approximately 40 μm to approximately 60 μm. For example, the radial distance is approximately 50 μm.

Figure 6D:
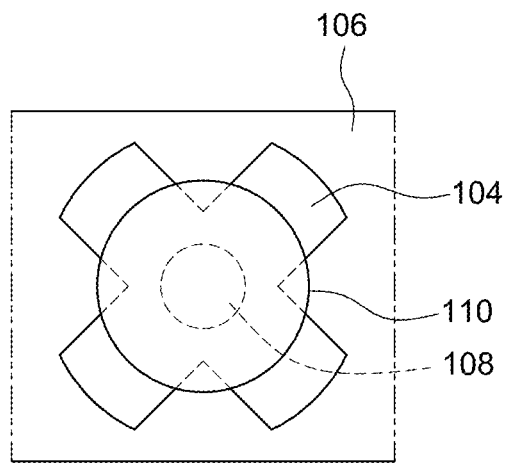
FIG. 6D depicts a layout of a conductive post in a semiconductor device package in accordance with some embodiments of the present disclosure.

FIG. 6D depicts a layout of a conductive post 110 in a semiconductor device package 10 in accordance with some embodiments of the present disclosure. The depicted layout is similar to the layout depicted in FIG. 6C, except that the opening defined by the isolation layer 106 is substantially X-shaped.

Figure 6E:
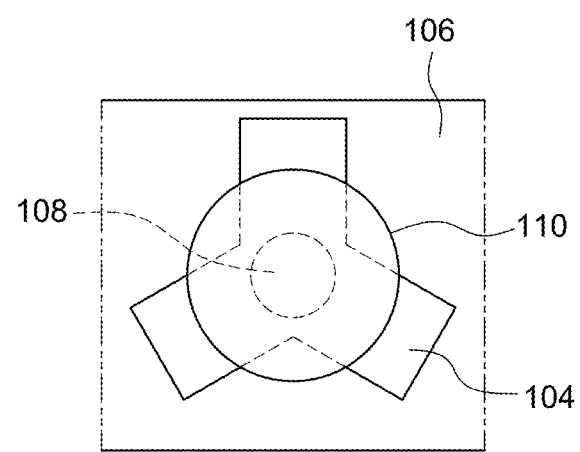
FIG. 6E depicts a layout of a conductive post in a semiconductor device package in accordance with some embodiments of the present disclosure.

FIG. 6E depicts a layout of a conductive post 110 in a semiconductor device package 10 in accordance with some embodiments of the present disclosure. The depicted layout is similar to the layout depicted in FIG. 6D, except that the opening defined by the isolation layer 106 is substantially Y-shaped.

Figure 6F:
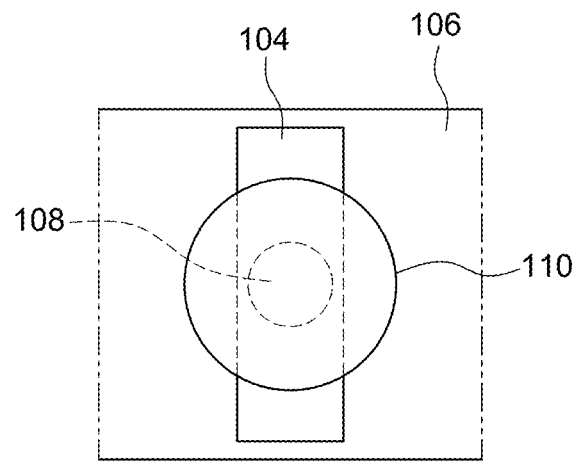
FIG. 6F depicts a layout of a conductive post in a semiconductor device package in accordance with some embodiments of the present disclosure.

FIG. 6F depicts a layout of a conductive post 110 in a semiconductor device package 10 in accordance with some embodiments of the present disclosure. The depicted layout is similar to the layout depicted in FIG. 6A, except that the opening defined by the isolation layer 106 is substantially in a rectangular shape. In some embodiments, a distance between a short edge of the opening and an outside edge of the conductive post 110 in the same plane may be in a range of approximately 40 μm to approximately 60 μm. For example, the radial distance is approximately 50 μm.

Figure 6G:
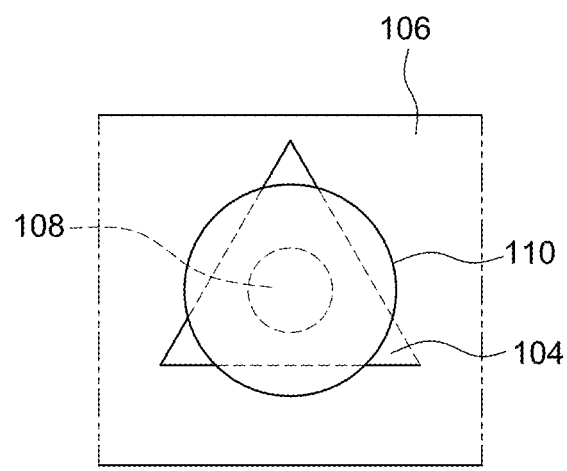
FIG. 6G depicts a layout of a conductive post in a semiconductor device package in accordance with some embodiments of the present disclosure.

FIG. 6G depicts a layout of a conductive post 110 in a semiconductor device package 10 in accordance with some embodiments of the present disclosure. The depicted layout is similar to the layout depicted in FIG. 6A, except that the opening defined by the isolation layer 106 is in a substantially a triangular shape. In some embodiments, a distance between one corner of the triangular opening and the outside edge of the conductive post 110 in the same plane may be in a range of approximately 40 μm to approximately 60 μm. For example, the radial distance is approximately 50 μm.

Figure 7A:
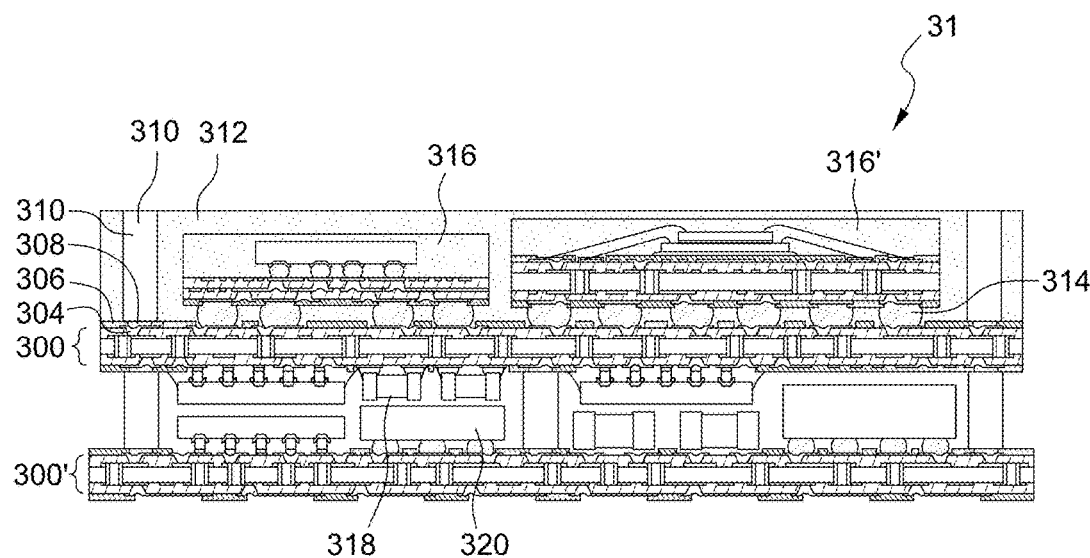
FIG. 7A is a cross-sectional view of a semiconductor device package in accordance with some embodiments of the present disclosure.

FIG. 7A is a cross-sectional view of a semiconductor device package 31 in accordance with some embodiments of the present disclosure. The semiconductor device package 31 includes carriers 300 and 300', a pad 304, an isolation layer 306, an interconnection layer 308, a conductive post 310, a molding compound 312, a solder ball 314, packages 316 and 316', and devices 318 and 320. The conductive post 310 is disposed on the isolation layer 306 and on the interconnection layer 308. A top surface of the isolation layer 306 and a top surface of the interconnection layer 308 are substantially coplanar. The packages 316 and 316' are each disposed on a front side of the carrier 300 (top side in FIG. 7A) via one or more respective solder balls 314. The molding compound 312 encapsulates the pad 304, the isolation layer 306, the conductive post 310, and the packages 316 and 316'. The device 318 is disposed on a back side of the carrier 300 (bottom side in FIG. 7A). A conductive post is disposed between the carriers 300 and 300'. The device 320 is disposed on a front side (top side in FIG. 7A) of the carrier 300'.

The carrier 300 may be the same as the carrier 300' or similar to the carrier 300'. The carrier 300 may be different from the carrier 300'. The carrier 300 may be and/or may include, for example, a printed circuit board, such as a paper-based copper foil laminate, a composite copper foil laminate, or a polymer-impregnated glass-fiber-based copper foil laminate. The carrier 300 may include an interconnection structure, such as an RDL or a grounding element. In some embodiments, the grounding element is a via exposed from a lateral surface of the carrier 300. In some embodiments, the grounding element is a metal layer exposed from the lateral surface of the carrier 300. In some embodiments, the grounding element is a metal trace exposed from the lateral surface of the carrier 300.

In some embodiments, the package 316 may be a flip package (e.g. suitable for flip chip assembly). The package 316' may be a wire-bonded package. The device 318 may be a passive device. The device 320 may be an active device. In some embodiments, the packages 316 and 316' and the devices 318 and 320 may be disposed on different positions of the carriers 300 and 300' according to different designs of semiconductor device packages. Other types of packages and/or devices in other combinations and/or configurations are also possible.

Figure 7B:
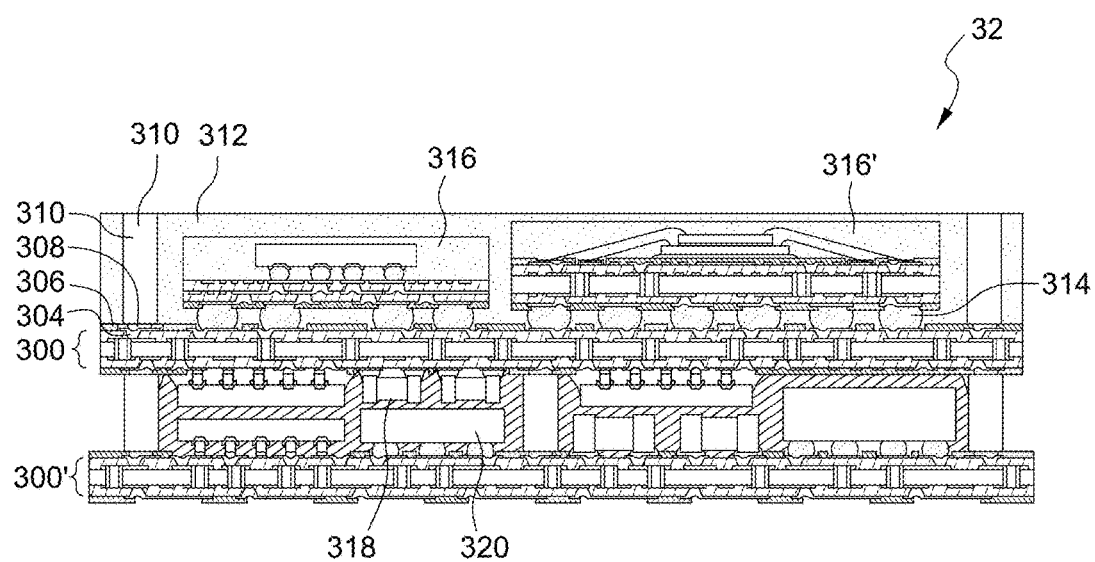
FIG. 7B is a cross-sectional view of a semiconductor device package in accordance with some embodiments of the present disclosure.

FIG. 7B is a cross-sectional view of a semiconductor device package 32 in accordance with some embodiments of the present disclosure. A structure of the semiconductor device package 32 is similar to that of the semiconductor device package 31. A difference between the semiconductor device package 32 and the semiconductor device package 31 is that in the semiconductor device package 32 there is an underfill resin disposed between the carriers 300 and 300'.

Figure 7C:
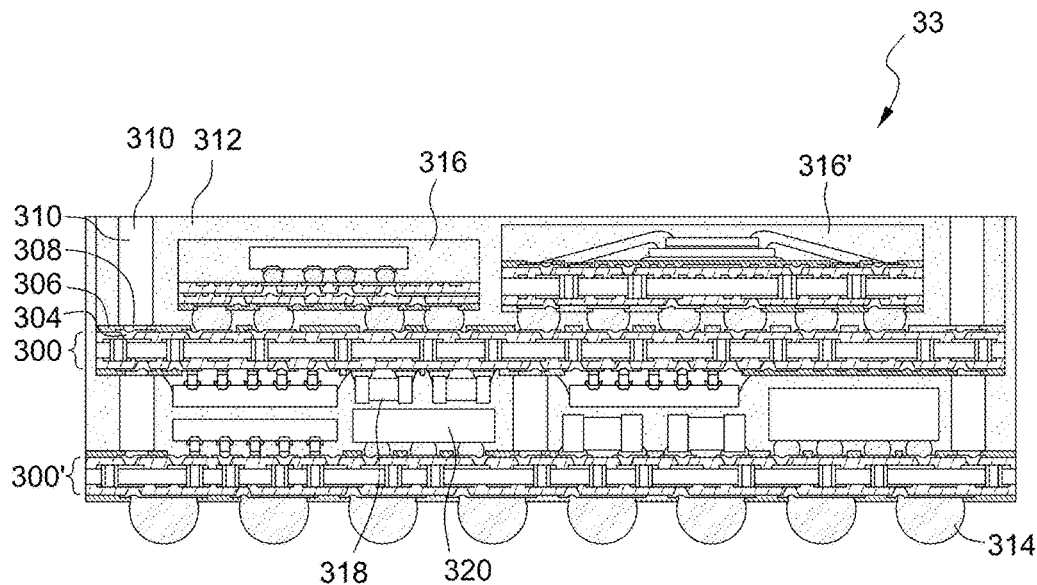
FIG. 7C is a cross-sectional view of a semiconductor device package in accordance with some embodiments of the present disclosure.

FIG. 7C is a cross-sectional view of a semiconductor device package 33 in accordance with some embodiments of the present disclosure. A structure of the semiconductor device package 33 is similar to that of the semiconductor device package 31. A difference between the semiconductor device package 33 and the semiconductor device package 31 is that in the semiconductor device package 33 there is a further molding compound disposed between the carriers 300 and 300', and an additional solder ball is disposed on the back side of the carrier 300'. The further molding compound is disposed on the front side of the carrier 300' and encapsulates carrier 300, the pad 304, the isolation layer 306, the conductive post 310, the solder ball 314, the packages 316 and 316', and the devices 318 and 320.

Figure 7D:
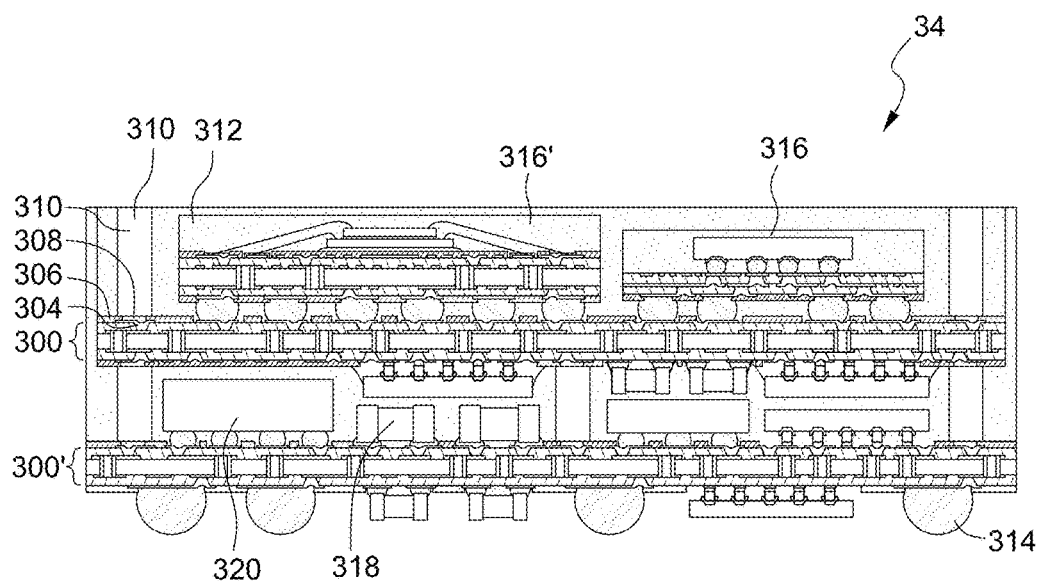
FIG. 7D is a cross-sectional view of a semiconductor device package in accordance with some embodiments of the present disclosure.

FIG. 7D is a cross-sectional view of a semiconductor device package 34 in accordance with some embodiments of the present disclosure. A structure of the semiconductor device package 34 is similar to that of the semiconductor device package 33. A difference between the semiconductor device package 34 and the semiconductor device package 33 is that in the semiconductor device package 34 at least one additional passive device and/or at least one additional active device are disposed on the back side of the carrier 300'.

Figure 7E:
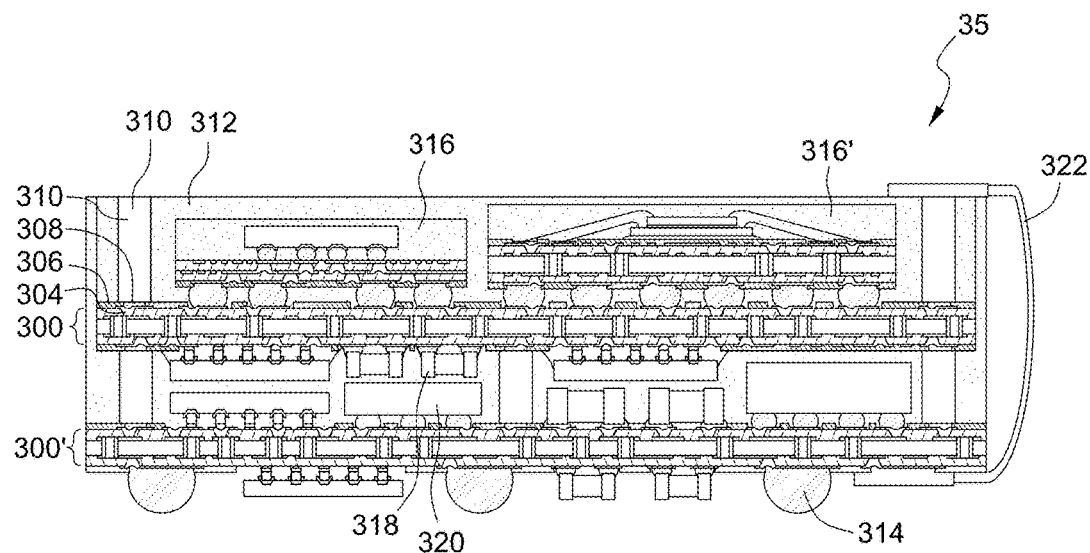
FIG. 7E is a cross-sectional view of a semiconductor device package in accordance with some embodiments of the present disclosure.

FIG. 7E is a cross-sectional view of a semiconductor device package 35 in accordance with some embodiments of the present disclosure. A structure of the semiconductor device package 35 is similar to that of the semiconductor device package 34. A difference between the semiconductor device package 35 and the semiconductor device package 34 is that in the semiconductor device package 35 an interconnection element 322 electrically connects the carrier 300 to the carrier 300'.

FIG. 8A, FIG. 8B, FIG. 8C, FIG. 8D, FIG. 8E, FIG. 8F, and FIG. 8G illustrate a method of manufacturing a semiconductor device package according to some embodiments of the present disclosure.

Figure 8A:
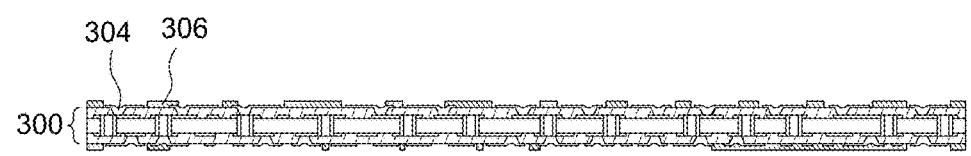
FIG. 8A, FIG. 8B, FIG. 8C, FIG. 8D, FIG. 8E, FIG. 8F, and FIG. 8G illustrate a method of manufacturing a semiconductor device package according to some embodiments of the present disclosure.

Referring to FIG. 8A, a method for manufacturing a semiconductor device package includes providing a carrier 300. The carrier 300 has a front side (top side in FIG. 8A) and a back side (bottom side in FIG. 8A). The front side is opposite the back side. A pad 304 is disposed on the front side of the carrier 300. An isolation layer 306 is disposed on the front side of the carrier 300 and may partially cover the pad 304. The isolation layer 306 may define one or more openings that expose the pad 304.

Figure 8B:
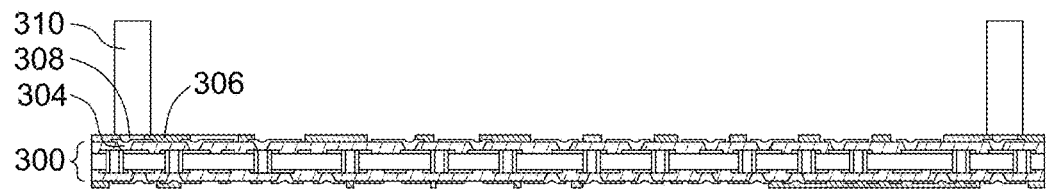

Referring to FIG. 8B, a conductive post 310 is disposed on the isolation layer 306 and on an interconnection layer 308. In some embodiments, the interconnection layer 308 is disposed on the pad 304 and the conductive post 310 is subsequently disposed on the interconnection layer 308. In another embodiment, the interconnection layer 308 is attached to the conductive post 310 and the conductive post 310 with the interconnection layer 308 attached is subsequently disposed on the pad 304.

Figure 8C:
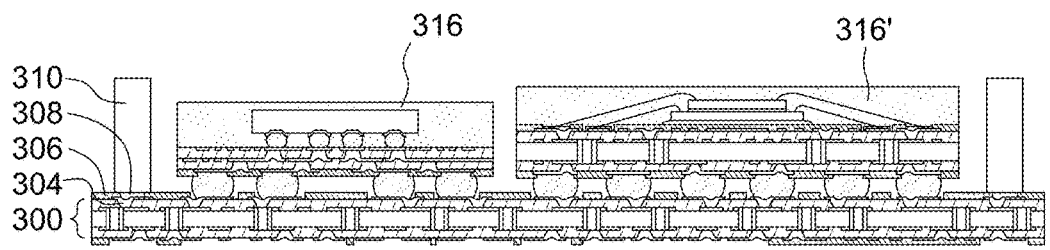

Referring to FIG. 8C, one or more solder balls 314 are disposed on the pad 304. Packages 316 and 316' are disposed on the front side of the carrier 300 via the solder ball 314. In some embodiments, the packages 316 and 316' may be the same kind of packages. In some embodiments, the packages 316 and 316' may be the different kinds of packages.

Figure 8D:
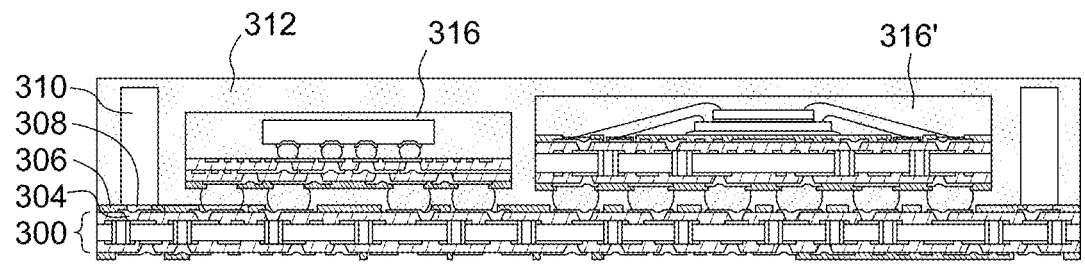

Referring to FIG. 8D, a molding compound 312 is applied on the front side of the carrier 300. The molding compound 312 encapsulates the pad 304, the isolation layer 306, the conductive post 310, and the packages 316 and 316'.

Figure 8E:
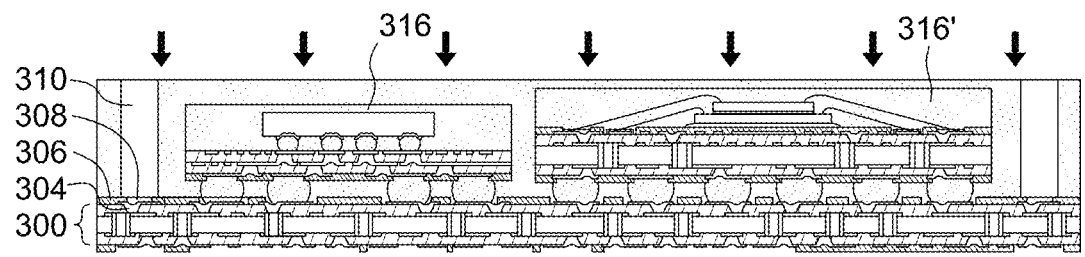

Referring to FIG. 8E, the molding compound 312 is grinded to expose the top surface of the conductive post 310.

Figure 8F:
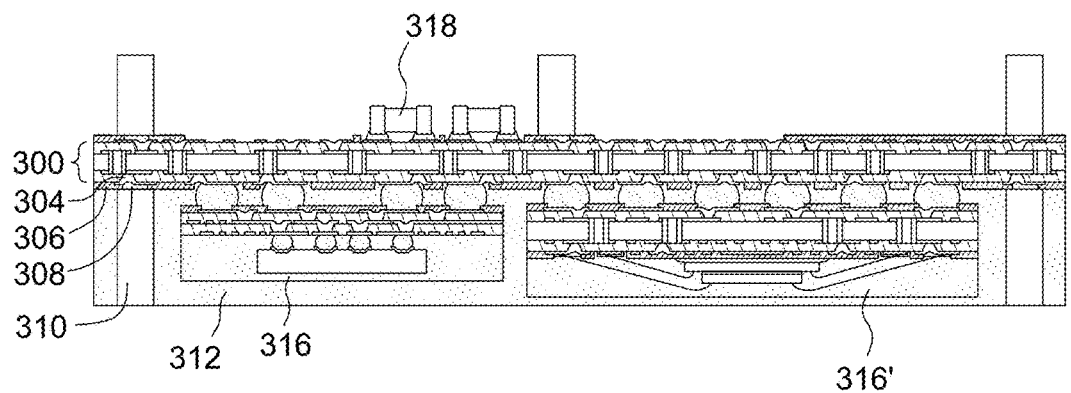

Referring to FIG. 8F, an additional conductive post is disposed on the back side of the carrier 300. A device 318 is disposed on the back side of the carrier 300.

Figure 8G:
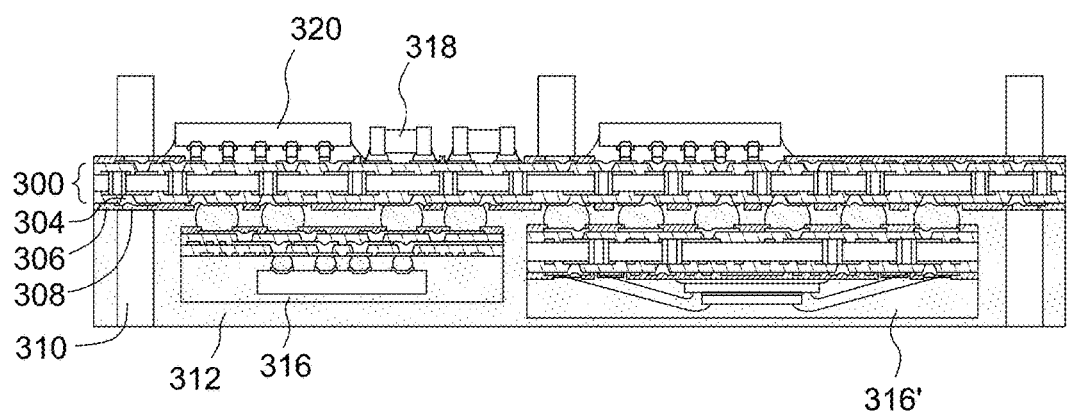

Referring to FIG. 8G, a device 320 is disposed on the back side of the carrier 300.

FIG. 9A, FIG. 9B, FIG. 9C, FIG. 9D, FIG. 9E, and FIG. 9F illustrate a method of manufacturing a semiconductor device package according to some embodiments of the present disclosure. The steps depicted in FIG. 9A, FIG. 9B, FIG. 9C, FIG. 9D, FIG. 9E, and FIG. 9F may, but need not, be performed subsequent to the steps depicted in FIG. 8A, FIG. 8B, FIG. 8C, FIG. 8D, FIG. 8E, FIG. 8F, and FIG. 8G.

Figure 9A:
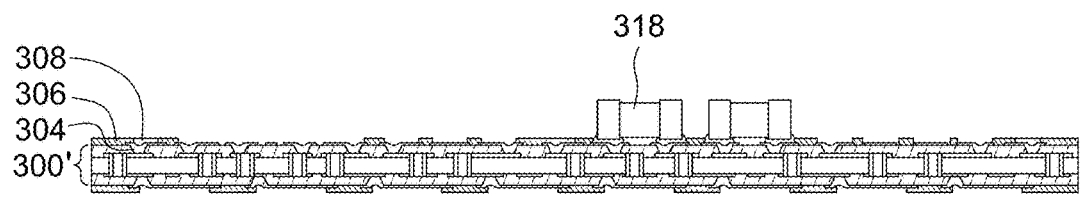
FIG. 9A, FIG. 9B, FIG. 9C, FIG. 9D, FIG. 9E, and FIG. 9F illustrate a method of manufacturing a semiconductor device package according to some embodiments of the present disclosure.

Referring to FIG. 9A, a method for manufacturing a semiconductor device package comprises providing a carrier 300'. The carrier 300' has a front side (top side in FIG. 9A) and a back side (bottom side in FIG. 9A). The front side is opposite the back side. A pad 304 is disposed on the front side of the carrier 300'. An isolation layer 306 is disposed on the front side of the carrier 300' and may partially cover the pad 304. A device 318 is disposed on the front side of the carrier 300'.

Figure 9B:
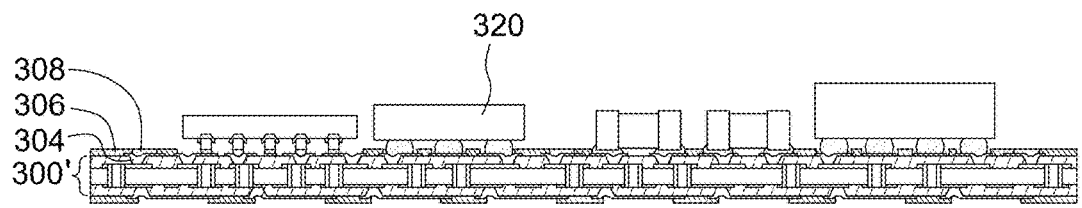

Referring to FIG. 9B, a device 320 is disposed on the front side of the carrier 300'.

Figure 9C:
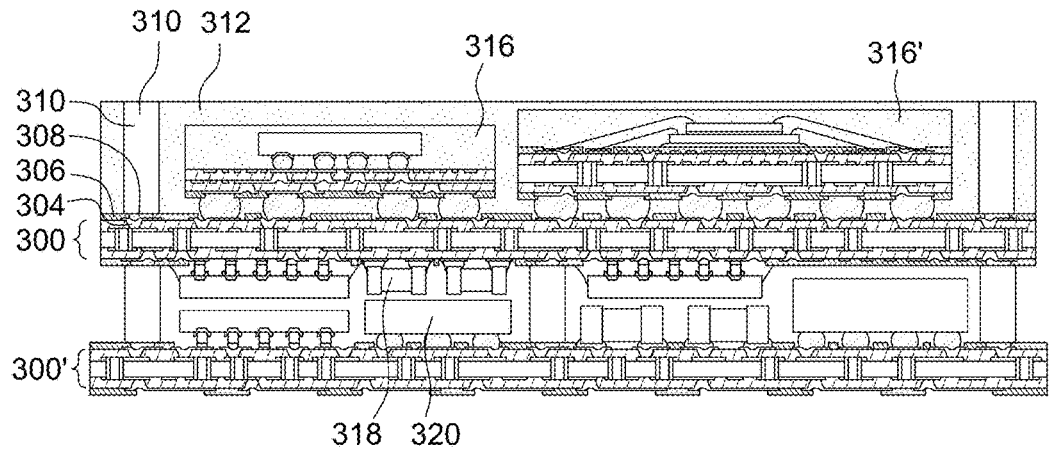

Referring to FIG. 9C, the structure as illustrated in FIG. 8G is disposed on the front side of the carrier 300'.

Figure 9D:
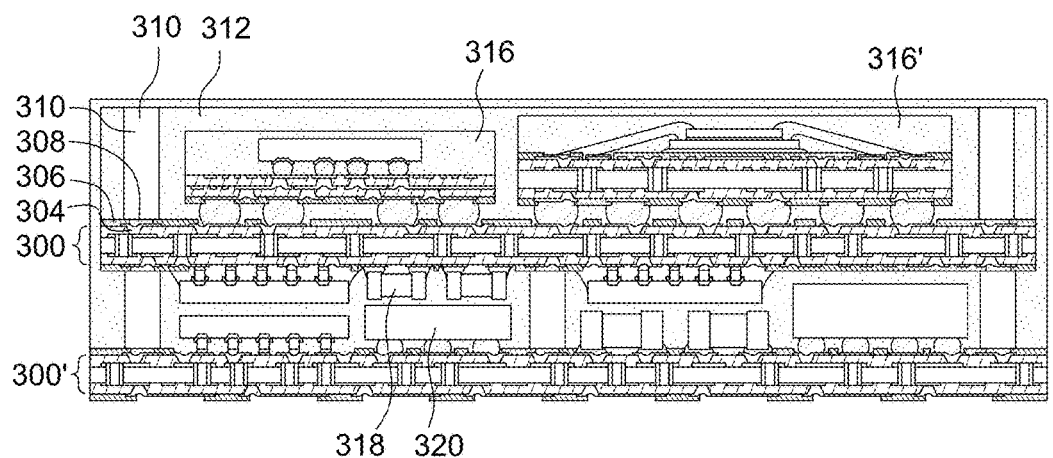

Referring to FIG. 9D, an additional molding compound 312 is applied on the front side of the carrier 300'. The additional molding compound 312 encapsulates carrier 300, the pad 304, the isolation layer 306, the conductive post 310, the solder ball 314, the packages 316 and 316', and the devices 318 and 320.

Figure 9E:
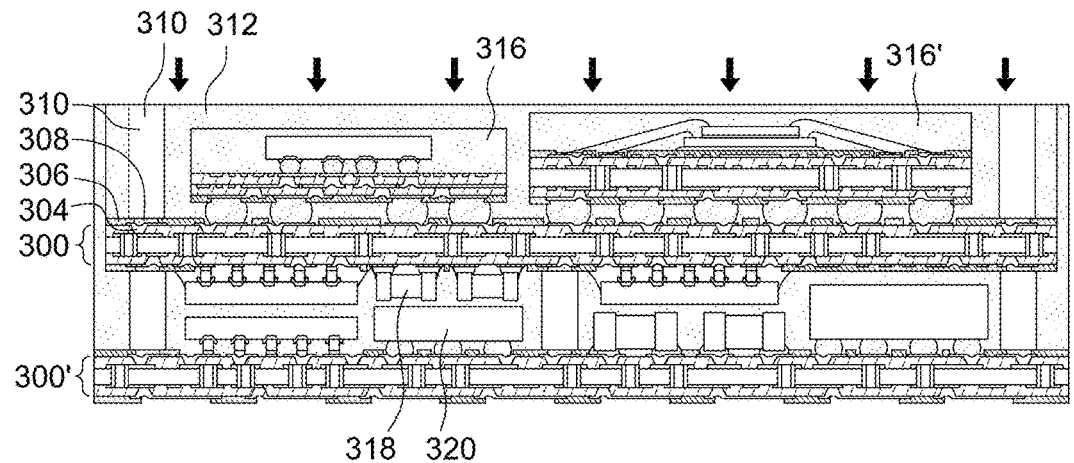

Referring to FIG. 9E, the additional molding compound 312 is grinded to expose the top surface of the conductive post 310.

Figure 9F:
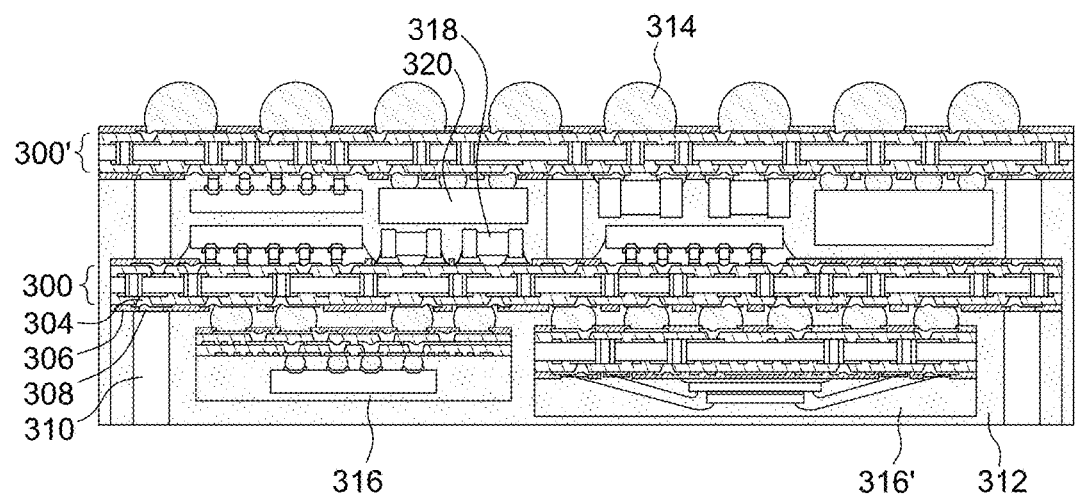

Referring to FIG. 9F, one or more additional solder balls are disposed on the back side of the carrier 300'.

FIG. 10A, FIG. 10B, FIG. 10C, FIG. 10D, and FIG. 10E illustrate a method of manufacturing a semiconductor device package according to some embodiments of the present disclosure. The steps depicted in FIG. 10A, FIG. 10B, FIG. 10C, FIG. 10D, and FIG. 10E may, but need not, be performed subsequent to the steps depicted in FIG. 9A, FIG. 9B, FIG. 9C, FIG. 9D, FIG. 9E, and FIG. 9F.

Figure 10A:
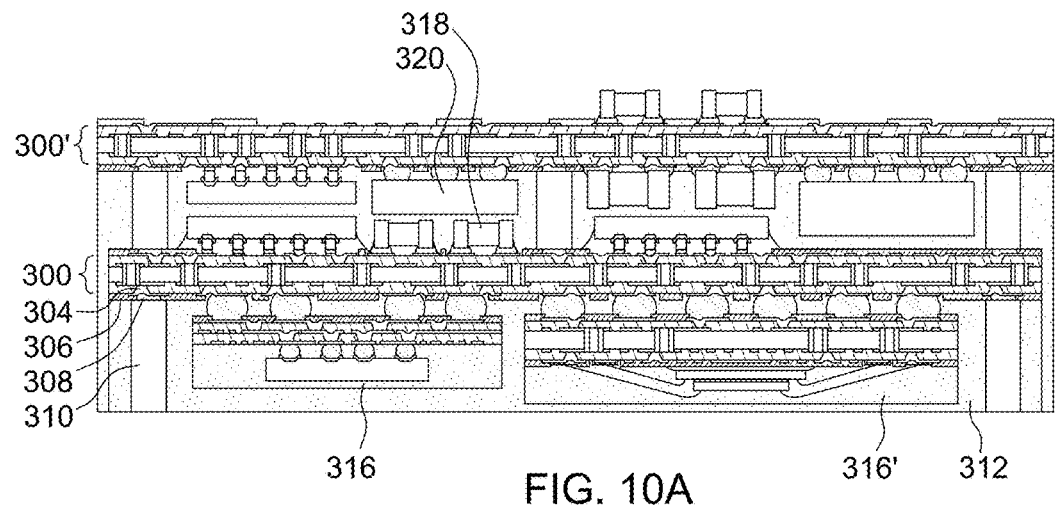
FIG. 10A, FIG. 10B, FIG. 10C, FIG. 10D, and FIG. 10E illustrate a method of manufacturing a semiconductor device package according to some embodiments of the present disclosure.

Referring to FIG. 10A, the structure as illustrated in FIG. 9E is provided. An additional device 318 is disposed on the back side of the carrier 300'.

Figure 10B:
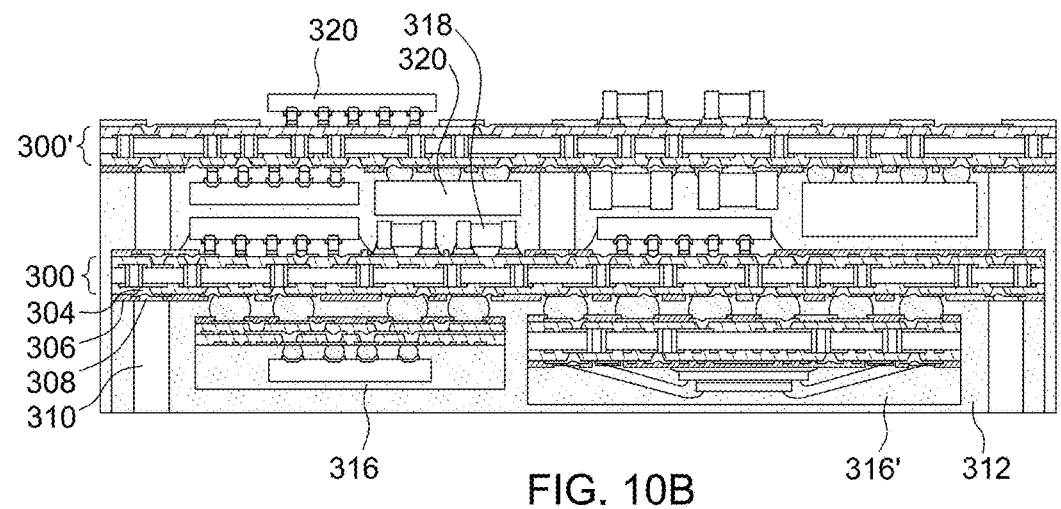

Referring to FIG. 10B, an additional device 320 is disposed on the back side of the carrier 300'.

Figure 10C:
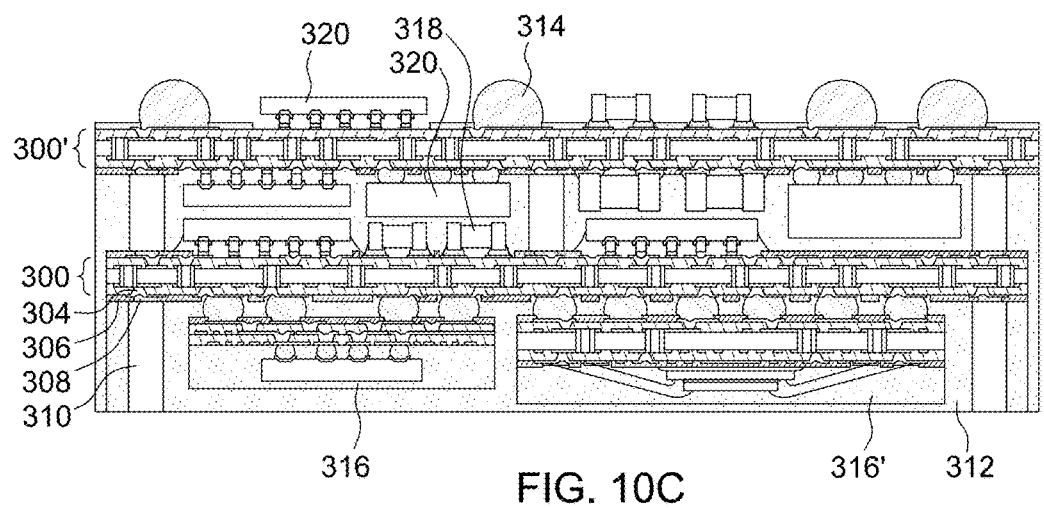

Referring to FIG. 10C, one or more additional solder balls 314 are disposed on the back side of the carrier 300'.

Figure 10D:
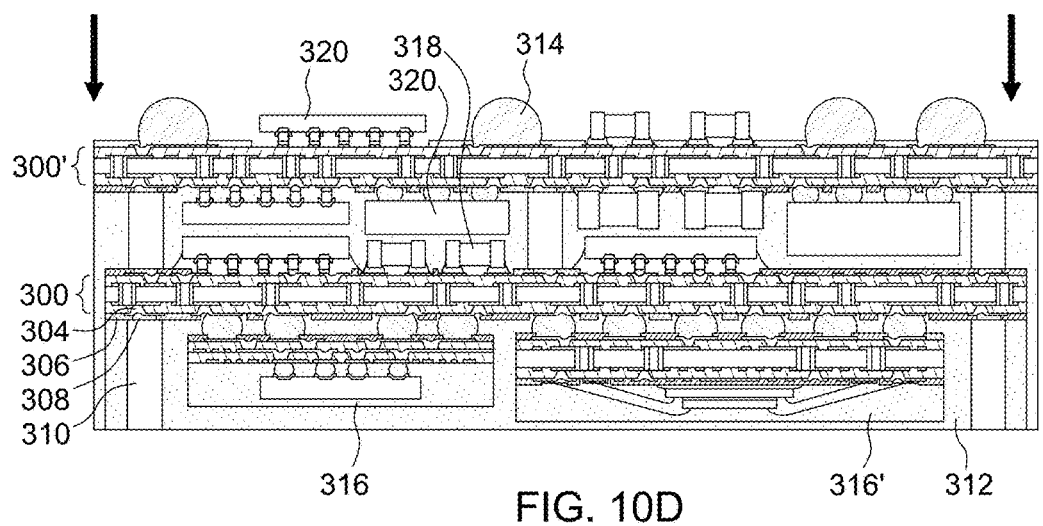

Referring to FIG. 10D, a singulation operation is performed to generate separate semiconductor device packages.

Figure 10E:
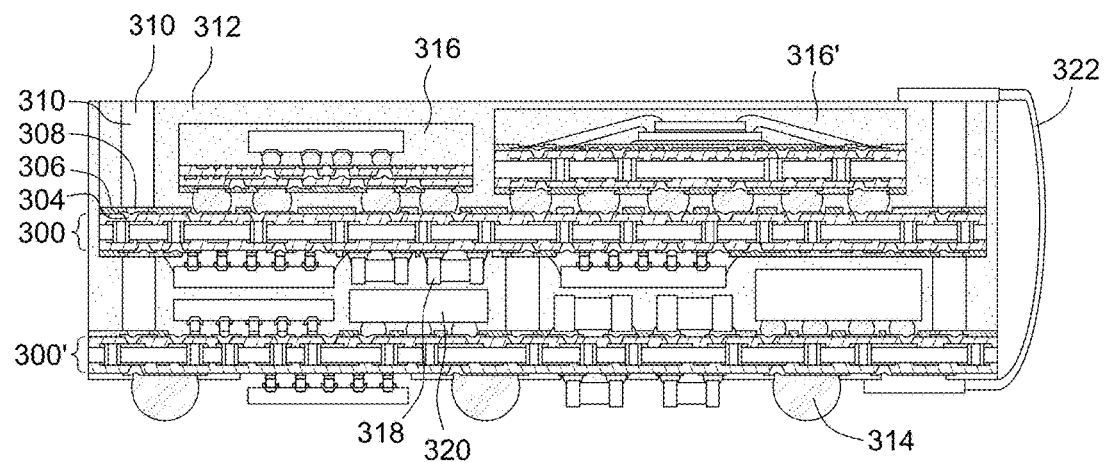

Referring to FIG. 10E, one end of an interconnection element 322 is disposed on a top surface of the molding compound 312 and contacts the conductive post 310, and another end of the interconnection element 322 is disposed on the back side of the carrier 300'. The interconnection element 322 electrically connects the carrier 300 to the carrier 300'.

Described in the present disclosure by way of example are embodiments of a through via structure and associated manufacturing techniques which provide, for example, for a reduction in package dimensions, including a reduction in a thickness of a finished semiconductor package.

Flip chip bonding techniques can benefit from thicker dies that are less prone to cracking. For example, it may be desirable for a die thickness to be greater than about 4 mm after grinding to avoid cracking during flip chip bonding.

Accordingly, in some structures in which total package thickness is a concern, a direct die bond technique may be implemented rather than flip chip bonding, which may achieve a manufacturing yield with a die thickness of about 2 mm.

Additionally, it may be desirable to seek to reduce a thickness of a substrate to achieve further reductions in total package thickness.

According to some embodiments of the present disclosure, a direct die bonding technique and a bump technique are implemented with a reduced thickness substrate to achieve reductions in total package thickness. The direct die bonding technique and the bump technique are suitable, for example, for single die packages or for multiple (e.g., stacked) die packages. A total package thickness of less than about 0.4 mm has been achieved for a package with three stacked dies according to some embodiments of the present disclosure.

Figure 11:
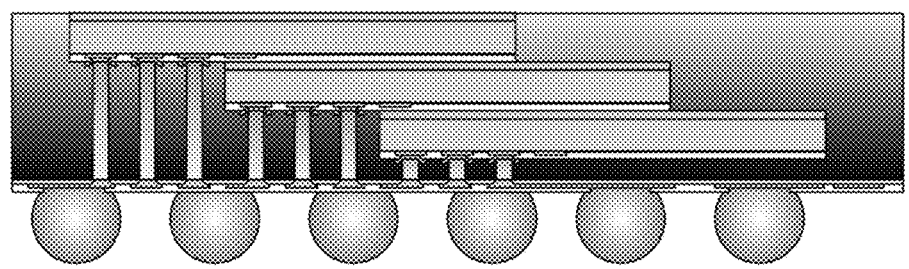
FIG. 11 is a cross-sectional view of a semiconductor device package according to some embodiments of the present disclosure.

FIG. 11 illustrates a semiconductor package according to some embodiments of the present disclosure. The semiconductor package depicted in FIG. 11, which includes three stacked dies, can be manufactured using a direct die bond technique and a bump technique to achieve a total package thickness of less than about 0.4 mm.

Figure 12A:
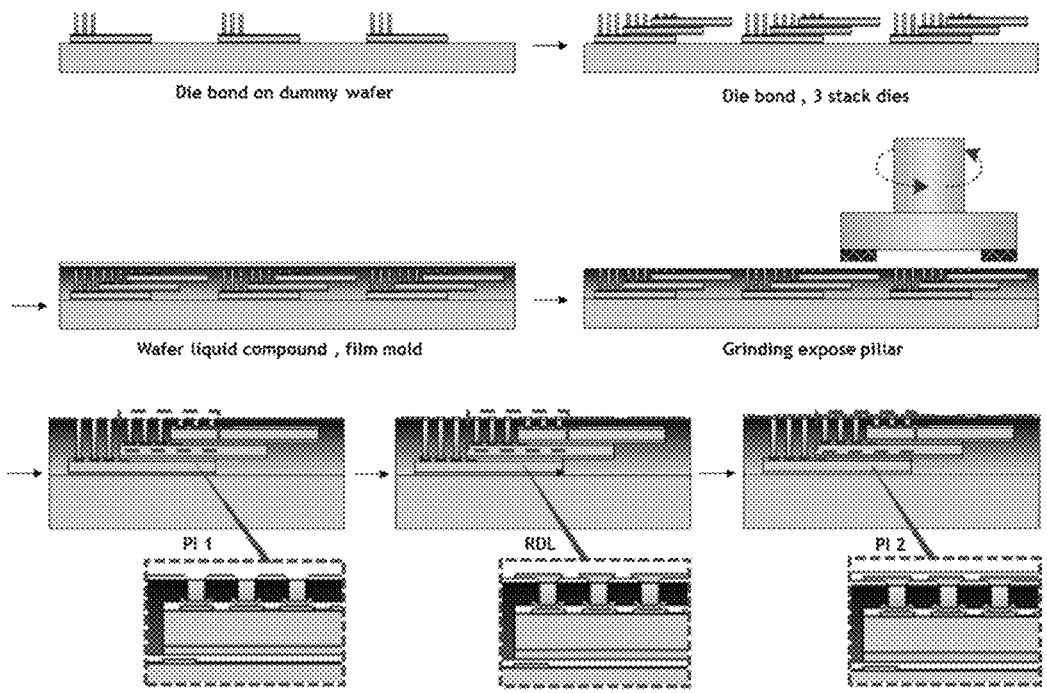
FIG. 12A, FIG. 12B, and FIG. 12C illustrate a method of manufacturing a semiconductor device package according to some embodiments of the present disclosure.

FIG. 12A illustrates a semiconductor packaging technique according to some embodiments of the present disclosure. As illustrated in FIG. 12A, a dummy wafer is first provided, and one or more dies are respectively bonded onto the dummy wafer within respective unit areas of a surface of the dummy wafer (which can be separated into individual units (e.g. singulated) at a later stage).

Referring still to FIG. 12A, one or more pillars are disposed on the dies, or the dies are provided with pillars prior to die bonding. Additional dies are respectively die bonded to the respective dies bonded to the dummy wafer, and additional pillars are disposed on the additional dies (e.g. on each additional die). Yet further dies (e.g. with additional pillars disposed thereon) may be respectively die bonded to the additional dies. As illustrated, three dies are bonded to each other in a stack, with pillars extending vertically (in the orientation shown) from the dies. In some implementations, more than three, or fewer than three, dies may be stacked by die bonding. After the dies have been stacked, a mold is disposed around the wafer and an encapsulation material is filled into the mold. For example, a liquid compound may be filled into the mold, to fill around the stacked dies and down to the dummy wafer.

The mold is removed, and the encapsulation material (after solidifying) is ground down to expose the pillars at a surface of the encapsulation material.

An insulation layer, such as a polyimide layer (referred to as PI1 in FIG. 12A), is disposed over the surface of the encapsulation material. The insulation layer defines openings, each of which exposes a respective pillar. Then, a redistribution layer (RDL) is disposed over the insulation layer and into the openings, making electrical contact with the pillars. Another insulation layer, such as a polyimide layer (referred to as PI2 in FIG. 12A), is disposed over the RDL.

Figure 12B:
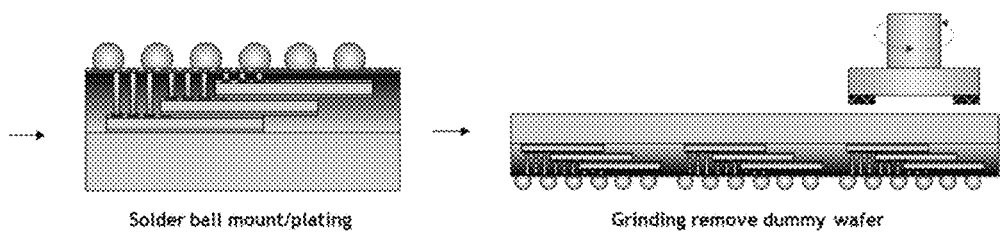

FIG. 12B illustrates a next stage of manufacture. Solder balls are disposed on the RDL. A solder ball may be positioned over a pillar, or positioned offset from a pillar. Thus, a pitch between the solder balls can be greater than a pitch between the pillars in some implementations.

As shown in FIG. 12B, after disposing the solder balls, the dummy wafer is ground down. In some embodiments, the dummy wafer may be substantially fully ground down (e.g. substantially removed), leaving a topmost die of the die stack exposed.

Figure 12C:
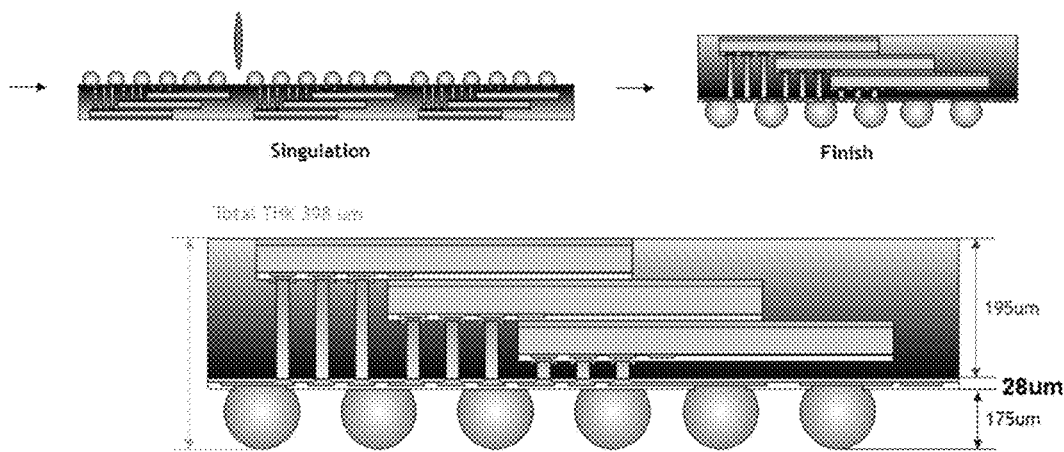

FIG. 12C illustrates a next stage of manufacture in which the unit areas are singulated to separate individual semiconductor packages, shown as a "Finish" stage in FIG. 12C, similar to the embodiments illustrated in FIG. 11. As shown in FIG. 12C, a total thickness of the finished semiconductor package is about 398 micrometers (μm).

The total thickness of the finished semiconductor package in FIG. 12C includes a solder ball height of about 175 μm, an RDL height of about 28 μm, and an encapsulation material height of about 195 μm. The longest of the pillars (e.g. those connected to a top-most die) are about 145 μm in height (vertically in the orientation shown), the middle pillars (e.g. those connected to a die positioned between (in a vertical direction) two other die) are about 85 μm, and the shortest of the pillars (e.g. those connected to a bottom-most die) are about 25 μm. Each of the dies is about 10 μm thick, the insulation layers are each about 9 μm thick, and the RDL is about 5 μm thick, with a total stacked die height of three dies of about 50-60 μm.

The pillars may be, or may include, copper. In one or more embodiments, one or more of the pillars are plated onto a respective die. In one or more embodiments, one or more of the pillars are pin mounted to a respective die. The pillars may have a similar diameter, or at least some pillars may have different diameters than each other.

Figure 13A:
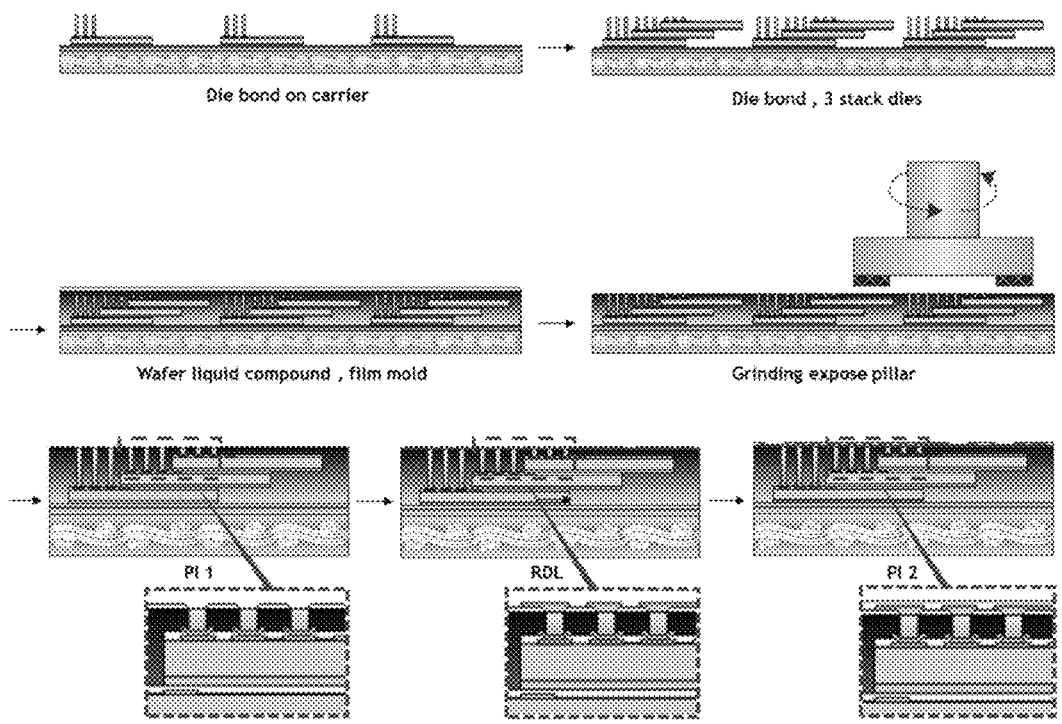
FIG. 13A, FIG. 13B, and FIG. 13C illustrate a method of manufacturing a semiconductor device package according to some embodiments of the present disclosure.

FIG. 13A illustrates a semiconductor packaging technique according to some embodiments of the present disclosure. As illustrated in FIG. 13A, a dummy carrier is first provided, and one or more dies are respectively bonded onto the carrier within respective unit areas of a surface of the carrier (which can be separated into individual units (e.g. singulated) at a later stage).

Referring still to FIG. 13A, one or more pillars are disposed on the dies, or the dies are provided with pillars prior to die bonding. Additional dies are respectively die bonded to the respective dies bonded to the carrier, and additional pillars are disposed on the additional dies (e.g. on each additional die). Yet further dies (e.g. with additional pillars disposed thereon) may be respectively die bonded to the additional dies. As illustrated, three dies are bonded to each other in a stack, with pillars extending vertically (in the orientation shown) from the dies. In some implementations, more than three, or fewer than three, dies may be stacked by die bonding. After the dies have been stacked, a mold is disposed around the wafer and an encapsulation material is filled into the mold. For example, a liquid compound may be filled into the mold, to fill around the stacked dies and down to the carrier.

The mold is removed, and the encapsulation material (after solidifying) is ground down to expose the pillars at a surface of the encapsulation material.

An insulation layer, such as a polyimide layer (referred to as PI1 in FIG. 13A), is disposed over the surface of the encapsulation material. The insulation layer defines openings, each of which exposes a respective pillar. Then, a redistribution layer (RDL) is disposed over the insulation layer and into the openings, making electrical contact with the pillars. Another insulation layer, such as a polyimide layer (referred to as PI2 in FIG. 13A), is disposed over the RDL.

Figure 13B:
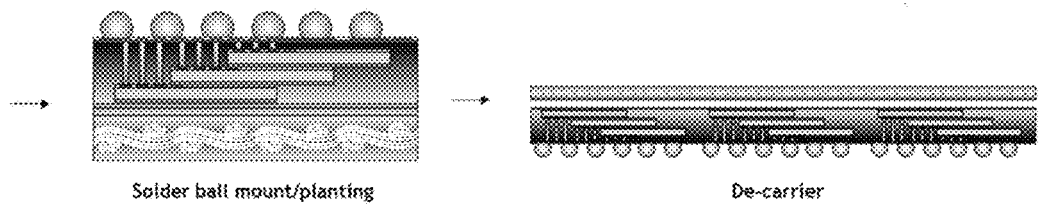

FIG. 13B illustrates a next stage of manufacture. Solder balls are disposed on the RDL. A solder ball may be positioned over a pillar, or positioned offset from a pillar. Thus, in some implementations a pitch between the solder balls can be greater than a pitch between the pillars.

As shown in FIG. 13B, after disposing the solder balls, the carrier is removed.

Figure 13C:
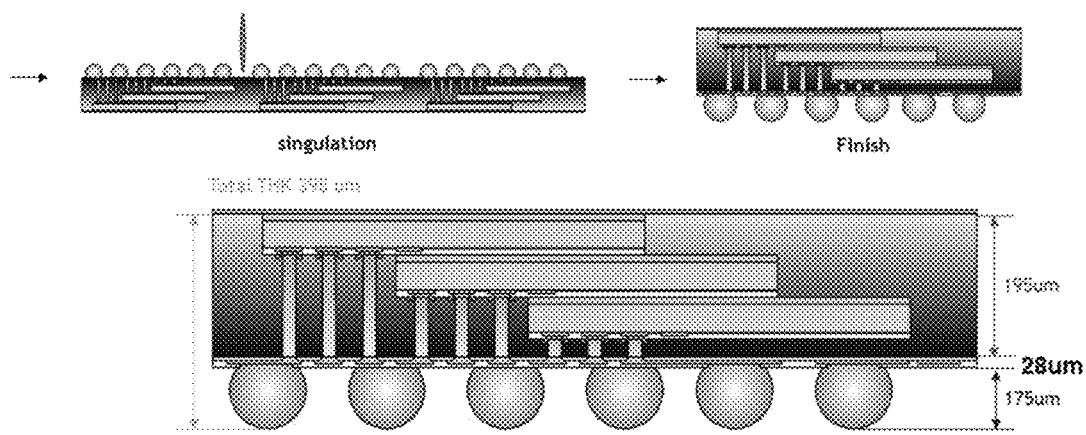

FIG. 13C illustrates a next stage of manufacture in which the unit areas are singulated to separate individual semiconductor packages, shown as a "Finish" stage in FIG. 13C, similar to the embodiments illustrated in FIG. 11. As shown in FIG. 13C, a total thickness of the finished semiconductor package is about 398 μm.

The total thickness of the finished semiconductor package in FIG. 13C includes a solder ball height of about 175 μm, an RDL height of about 28 μm, and an encapsulation material height of about 195 μm. The longest of the pillars (e.g. those connected to a top-most die) are about 145 μm in height (vertically in the orientation shown), the middle pillars (e.g. those connected to a die positioned between (in a vertical direction) two other die) are about 85 μm, and the shortest of the pillars (e.g. those connected to a bottom-most die) are about 25 μm. Each of the dies is about 10 μm thick, the insulation layers are each about 9 μm thick, and the RDL is about 5 μm thick, with a total stacked die height of the three dies of about 50-60 μm.

The pillars may be, or may include, copper. In one or more embodiments, one or more of the pillars are plated onto a respective die. In one or more embodiments, one or more of the pillars are pin mounted to a respective die. The pillars may have a similar diameter, or at least some pillars may have different diameters than each other.

Figure 14:
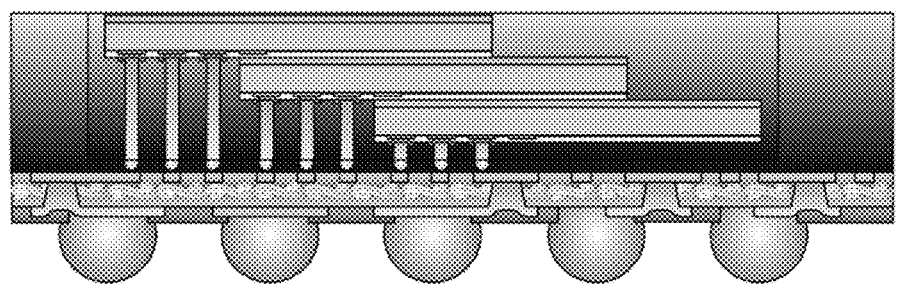
FIG. 14 is a cross-sectional view of a semiconductor device package according to some embodiments of the present disclosure.

FIG. 14 illustrates a semiconductor package according to some embodiments of the present disclosure.

Figure 15A:
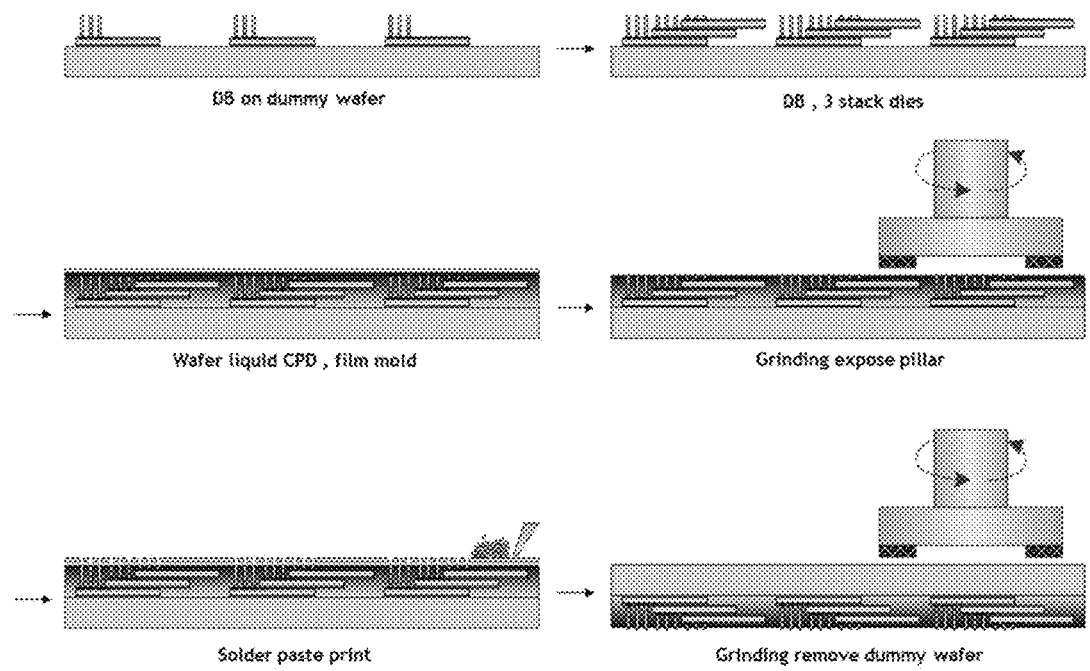
FIG. 15A, FIG. 15B, FIG. 15C, and FIG. 15D illustrate a method of manufacturing a semiconductor device package according to some embodiments of the present disclosure.

FIG. 15A illustrates a semiconductor packaging technique according to some embodiments of the present disclosure. As illustrated in FIG. 15A, a dummy wafer is first provided, and one or more dies are respectively bonded onto the dummy wafer within respective unit areas of a surface of the dummy wafer (which can be separated into individual units (e.g. singulated) at a later stage).

Referring still to FIG. 15A, one or more pillars are disposed on the dies, or the dies are provided with pillars prior to die bonding. Additional dies are respectively die bonded to the respective dies bonded to the dummy wafer, and additional pillars are disposed on the additional dies (e.g. on each additional die). Yet further dies (e.g. with additional pillars disposed thereon) may be respectively die bonded to the additional dies. As illustrated, three dies are bonded to each other in a stack, with pillars extending vertically (in the orientation shown) from the dies. In some implementations, more than three, or fewer than three, dies may be stacked by die bonding. After the dies have been stacked, a mold is disposed around the wafer and an encapsulation material is filled into the mold. For example, a liquid compound may be filled into the mold, to fill around the stacked dies and down to the dummy wafer.

The mold is removed, and the encapsulation material (after solidifying) is ground down to expose the pillars at a surface of the encapsulation material.

Solder paste is disposed on the exposed pillars, such as by a solder paste printing technique.

As shown in FIG. 15A, after disposing the solder paste, the dummy wafer is ground down. In one or more embodiments, the dummy wafer is substantially fully ground down (e.g. substantially removed), leaving a topmost die of the die stack exposed.

Figure 15B:
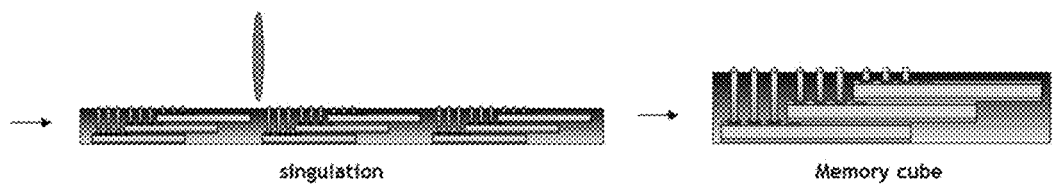

FIG. 15B illustrates a next stage of manufacture in which the unit areas are singulated to separate individual semiconductor package units. In FIG. 15B, the individual semiconductor package units are labeled by way of example as "Memory Cube," but the techniques described are not limited to memory units.

Figure 15C:
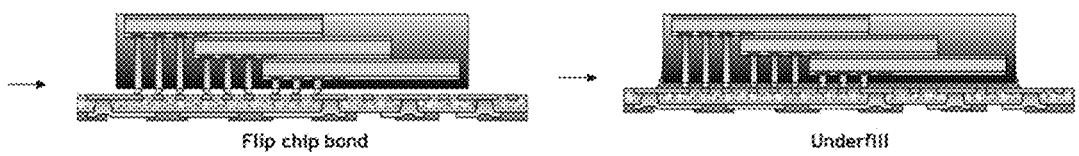

FIG. 15C illustrates a next stage of manufacture in which one or more of the individual semiconductor package units are flip chip bonded to a carrier (e.g., a substrate with an RDL), and an underfill is applied between the semiconductor package unit(s) and the carrier.

Figure 15D:
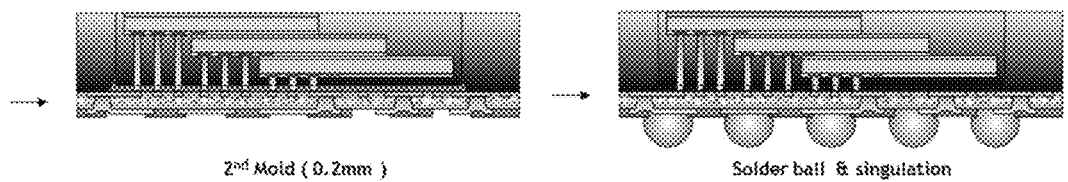

FIG. 15D illustrates a next stage of manufacture in which the semiconductor package unit(s) and a surface of the carrier are encapsulated by an encapsulation material (e.g., by a molding material) in a second molding process, and solder balls are applied. Subsequently, if applicable, the carrier and encapsulation material may be singulated into individual devices, similar to the semiconductor package shown in FIG. 14.

Figure 16A:
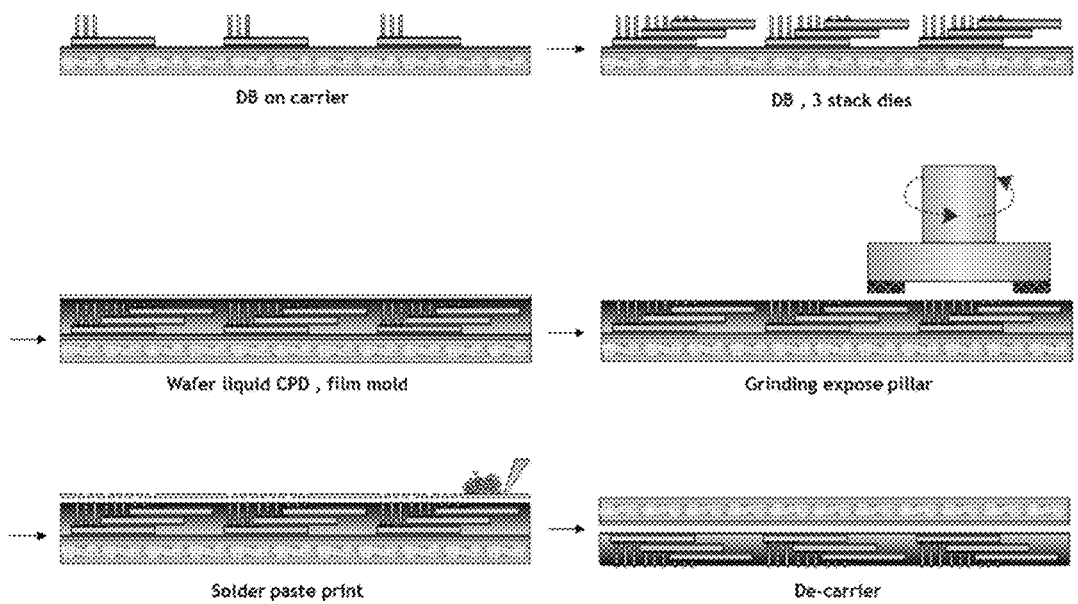
FIG. 16A, FIG. 16B, FIG. 16C, and FIG. 16D illustrate a method of manufacturing a semiconductor device package according to some embodiments of the present disclosure.

FIG. 16A illustrates a semiconductor packaging technique according to some embodiments of the present disclosure. As illustrated in FIG. 16A, a dummy carrier is first provided, and one or more dies are respectively bonded onto the carrier within respective unit areas of a surface of the carrier (which can be separated into individual units (e.g. singulated) at a later stage).

Referring still to FIG. 16A, one or more pillars are disposed on the dies, or the dies are provided with pillars prior to die bonding. Additional dies are respectively die bonded to the respective dies bonded to the carrier, and additional pillars are disposed on the additional dies (e.g. on each additional die). Yet further dies (e.g. with additional pillars disposed thereon) may be respectively die bonded to the additional dies. As illustrated, three dies are bonded to each other in a stack, with pillars extending vertically (in the orientation shown) from the dies. In some implementations, more than three, or fewer than three, dies may be stacked by die bonding. After the dies have been stacked, a mold is disposed around the wafer and an encapsulation material is filled into the mold. For example, a liquid compound may be filled into the mold, to fill around the stacked dies and down to the carrier.

The mold is then removed, and the encapsulation material (after solidifying) is ground down to expose the pillars at a surface of the encapsulation material.

Solder paste is disposed on the exposed pillars, such as by a solder paste printing technique. As shown in FIG. 16A, after disposing the solder paste, the carrier is removed.

Figure 16B:
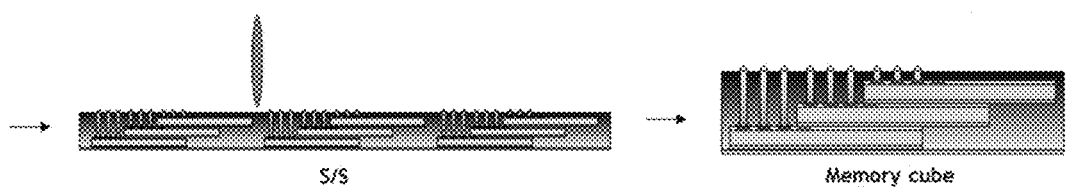

FIG. 16B illustrates a next stage of manufacture in which the unit areas are singulated to separate individual semiconductor package units. In FIG. 16B, the individual semiconductor package units are labeled by way of example as "Memory Cube," but the techniques described are not limited to memory units.

Figure 16C:
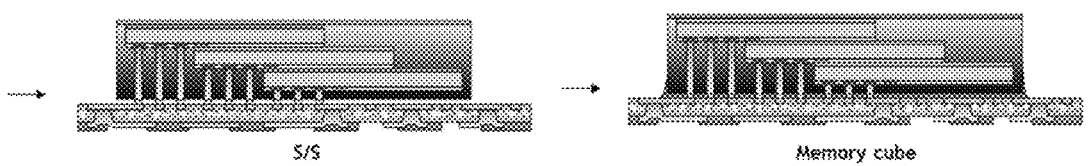

FIG. 16C illustrates a next stage of manufacture in which one or more of the individual semiconductor package units are flip chip bonded to a carrier (e.g., a substrate with an RDL), and an underfill is applied between the semiconductor package unit(s) and the carrier.

Figure 16D:
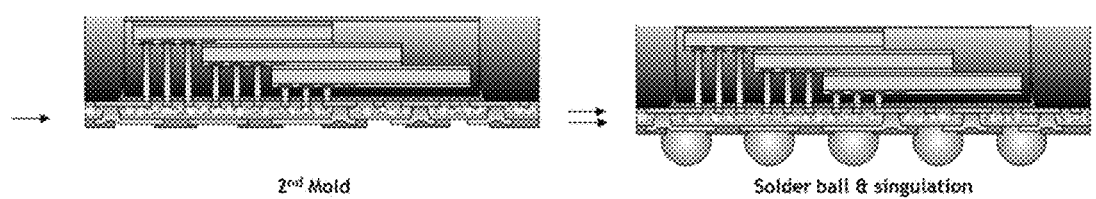

FIG. 16D illustrates a next stage of manufacture in which the semiconductor package unit(s) and a surface of the carrier are encapsulated by an encapsulation material (e.g., by a molding material) in a second molding process, and solder balls are applied. Subsequently, if applicable, the carrier and encapsulation material may be singulated into individual devices, such as the semiconductor package shown in FIG. 14.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package, comprising:
   a substrate;
   a first isolation layer disposed on the substrate, the first isolation layer including an opening;
   a pad disposed on the substrate and exposed from the opening;
   an interconnection layer disposed on the pad; and
   a pre-formed conductive post including a bottom surface, the bottom surface having a first part disposed on the interconnection layer and a second part disposed on and in contact with the first isolation layer.

2. The semiconductor package of claim 1, wherein the first part contacts the interconnection layer and the second part contacts the first isolation layer.

3. The semiconductor package of claim 1, wherein an area of the first part of the bottom surface of the pre-formed conductive post is substantially the same as, or larger than, a total area of the second part of the bottom surface of the pre-formed conductive post.

4. The semiconductor package of claim 1, wherein a top surface of a portion of the interconnection layer is exposed from the pre-formed conductive post.

5. The semiconductor package of claim 4, wherein the portion of the interconnection layer is in contact with the first isolation layer.

6. The semiconductor package of claim 5, further comprising a second isolation layer encapsulating the pre-formed conductive post.

7. The semiconductor package of claim 6, wherein the second isolation layer is in contact with the top surface of the interconnection layer.

8. The semiconductor package of claim 6, wherein the second isolation layer is spaced apart from the pad by the interconnection layer.

9. The semiconductor package of claim 6, wherein the second isolation layer is disposed on the pad and encapsulates the interconnection layer.

10. The semiconductor package of claim 9, wherein the interconnection layer is spaced apart from the first isolation layer by the second isolation layer.

11. The semiconductor package of claim 1, wherein the pad is spaced apart from the first isolation layer by the interconnection layer.

12. The semiconductor package of claim 1, wherein the interconnection layer has a substantially rectangular shape.

13. The semiconductor package of claim 1, wherein the interconnection layer has a substantially circular shape.

14. A semiconductor package, comprising:
    a substrate;
    a first isolation layer disposed on the substrate, the first isolation layer including an opening;
    a pad disposed on the substrate and exposed from the opening;
    an interconnection layer disposed on pad;
    a second isolation layer disposed on and in contact with the pad and encapsulating the interconnection layer; and
    a conductive post disposed on the interconnection layer and on the second isolation layer.

15. The semiconductor package of claim 14, wherein the conductive post has a bottom surface including a first part and a second part, and the first part contacts a top surface of the interconnection layer and the second part contacts the first isolation layer.

16. The semiconductor package of claim 14, wherein the second isolation layer encapsulates the first isolation layer and the conductive post.

17. The semiconductor package of claim 14, wherein the interconnection layer has a substantially rectangular shape.

18. The semiconductor package of claim 14, wherein the interconnection layer has a substantially circular shape.

* * * * *